United States Patent
Takai et al.

(10) Patent No.: US 7,700,165 B2
(45) Date of Patent: Apr. 20, 2010

(54) METHOD OF FORMING DEPOSITED FILM AND METHOD OF FORMING PHOTOVOLTAIC ELEMENT

(75) Inventors: Yasuyoshi Takai, Kawasaki (JP); Masafumi Sano, Yokohama (JP); Keishi Saito, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 549 days.

(21) Appl. No.: 11/627,066

(22) Filed: Jan. 25, 2007

(65) Prior Publication Data

US 2007/0184191 A1 Aug. 9, 2007

(30) Foreign Application Priority Data

Feb. 3, 2006 (JP) .............................. 2006-026625

(51) Int. Cl.
*H05H 1/24* (2006.01)
(52) U.S. Cl. .................. 427/569; 427/535; 427/574; 427/582; 427/585; 427/248.1; 136/258; 257/63; 257/64; 257/65; 257/347; 438/97; 438/98; 438/484
(58) Field of Classification Search ............... 427/569; 136/258; 257/347
See application file for complete search history.

(56) References Cited

U.S. PATENT DOCUMENTS 6,218,702 B1 * 4/2001 Yamazaki et al. ........... 257/347
6,326,304 B1 * 12/2001 Yoshimi et al. ............. 438/680
6,483,021 B2 11/2002 Saito

FOREIGN PATENT DOCUMENTS

| JP | 11-243219 A | 9/1999 |
|---|---|---|
| JP | 11-330520 | 11/1999 |
| JP | 2000-252484 A | 9/2000 |
| JP | 2002-026348 | 1/2002 |
| JP | 2002-289530 | 10/2002 |

OTHER PUBLICATIONS

V.Golubev et al. Phys. Solid State 39(8), Aug. 1997, pp. 1197-1201.*
R. Rizzoli et al. Journal of Non-Crystalline Solids, vol. 299-302, (2002), pp. 1203-1207.*
K. Tanaka et al. Journal of Materials Science, vol. 22, (1987), pp. 2192-2198.*

* cited by examiner

*Primary Examiner*—Nadine Norton
*Assistant Examiner*—Maki Angadi
(74) *Attorney, Agent, or Firm*—Fitzpatrick, Cella, Harper & Scinto

(57) ABSTRACT

Provided is a deposited film containing microcrystalline silicon by plasma CVD, which includes changing at least one of conditions selected from a high frequency power density, a bias voltage with respect to an interelectrode distance, a bias current with respect to an electrode area, a high frequency power with respect to a source gas flow rate, a ratio of a diluting gas flow rate to a source gas flow rate, a substrate temperature, a pressure, and an interelectrode distance, between conditions for forming a deposited film of a microcrystalline region and conditions for forming a deposited film of an amorphous region; and forming a deposited film under conditions within a predetermined range in the vicinity of boundary conditions under which the crystal system of the deposited film substantially changes between a amorphous state and a microcrystalline state.

4 Claims, 7 Drawing Sheets

METHOD OF FORMING DEPOSITED FILM AND METHOD OF FORMING PHOTOVOLTAIC ELEMENT

BACKGROUND OF THE INVENTION

1. Field of the Invention

The present invention relates to a method of forming a deposited film, and more particularly, to a silicon-based deposited film, and a method of forming a photovoltaic element using a silicon-based deposited film such as a solar cell.

2. Description of the Related Art

High frequency plasma CVD is an excellent method of mass-producing a silicon-based deposited film because a large area film can be formed easily at a low temperature and the process throughput is improved. A solar cell which is an application of a silicon-based deposited film to a product has an advantage in that the energy source is unlimited and the power generation process is clean as compared with a case of existing energy utilizing fossil fuel. However, in order to make a solar cell widely available, further reduction of costs is necessary. In attaining this, one important technical problem to be solved is to improve the film forming rate by high frequency plasma CVD and to establish technology for further improvement in the characteristics.

Japanese Patent Application Laid-Open No. H11-330520 discloses technology for a method of manufacturing a crystalline silicon-based deposited film layer. According to Japanese Patent Application Laid-Open No. H11-330520, a silicon-based deposited film layer can be formed at a high rate under the conditions under which a silane-based gas and hydrogen gas are included, the pressure inside a reaction chamber is set to be 666.61 Pa or more, and the distance between a substrate and an electrode is 1 cm or less. Further, a photoelectronic conversion device using the silicon-based deposited film layer has high conversion efficiency.

Japanese Patent Application Laid-Open No. 2000-252484 discloses technology of forming an amorphous silicon film under the conditions under which the partial pressure of an $SiH_4$-based gas is 159.986 Pa or more and 2666.44 Pa or less, the interelectrode distance is 8 mm or more and 15 mm or less, and diluting hydrogen gas is four times or less of the $SiH_4$-based gas.

Further, Japanese Patent Application Laid-Open No. H11-243219 discloses technology for a stacked photovoltaic element formed by stacking at least a constitution element with a pin junction element comprising a microcrystalline semiconductor in the i-type layer and a constitution element with a pin junction comprising an amorphous semiconductor in the i-type layer. According to Japanese Patent Application Laid-Open No. H11-243219, by providing a stacked photovoltaic element in which a current value is determined by the constitution element with the pin junction comprising the microcrystalline semiconductor in the i-type layer, photodegradation of the photovoltaic element can be suppressed to improve the characteristics.

The technologies disclosed in the above-mentioned patent documents and the like gradually improve the characteristics of a silicon-based deposited film formed by plasma CVD. For example, by carrying out plasma CVD at a relatively higher pressure (600 Pa or more) with a smaller interelectrode distance (10 mm or less) as compared with a conventional method, a deposited film containing microcrystalline silicon having relatively good characteristics can be formed at a high deposition rate of 1 nm/sec or more. A photovoltaic element such as a solar cell formed by those technologies has an improved conversion efficiency, a suppressed degradation ratio, and thus, better characteristics. Further, similarly, the characteristics of amorphous silicon are also improved by adjusting conditions for forming the deposited film.

However, in order to attain more excellent characteristics and further reduction of costs of the above-mentioned photovoltaic element or the like, there are still various problems to be solved.

As a first problem, in order to improve the conversion efficiency, it is necessary to find the well-balanced optimum conditions for forming a deposited film which is improved in both a short circuit current value and an open circuit voltage value at the same time.

The short circuit current value can be improved by, for example, making larger the crystallization ratio and the crystal grain diameter of the deposited film, and by making lower the defect density of the crystal boundaries. However, it has been found that a larger short circuit current value tends to make the open circuit voltage value smaller.

On the other hand, it has been found that, when the deposited film is amorphous (when the amount of amorphous component in the deposited film increases), the open circuit voltage value tends to become larger while the short circuit current value tends to become smaller.

In this way, the short circuit current value and the open circuit voltage value tend to be mutually contradictory depending on the crystallization ratio in the deposited film and other characteristics. Therefore, to find the well-balanced optimum conditions for forming the deposited film which is improved in both the short circuit current value and the open circuit voltage value at the same time, a lot of experiments are necessary, and adjustment of the conditions is extremely difficult.

As a second problem, in order to suppress the degradation, it is necessary to find the optimum conditions for forming the deposited film which can suppress the degradation ratio.

In a deposited film containing microcrystalline silicon, there is a problem that, when the crystal grain diameter is small, or when there are many defects in the crystal boundaries, it is impossible to attain an open circuit voltage value which is large enough for a solar cell, and the short circuit current value is small. In addition, there is also a problem that the film quality is degraded and the electrical characteristics and the like are lowered with the elapse of time.

Further, depending on the conditions for forming a deposited film, the ratio of microcrystals in the deposited film is decreased and the amount of the amorphous component is increased relatively. Depending on the thickness of the deposited film, in the case of light irradiation for a long period of time, weak bonds of those bonds constituting a network are broken and the number of dangling bonds increases, which has an adverse effect on the characteristics. When such a deposited film is adopted as an i-type layer of a pin junction of a photoelectric conversion device such as a solar cell, depending on the layer structure of the solar cell, degradation of the characteristics due to photodegradation is increased. Although those characteristics change depending on the conditions for forming the deposited film, the correlation between the conditions for forming the deposited film and the above-mentioned characteristics is not necessarily clarified, and thus, it is difficult to form a deposited film containing microcrystals having the optimum characteristics required for a photovoltaic element such as a solar cell.

On the other hand, the degradation ratio of amorphous silicon is not necessarily fixed, and significant differences exist in the degradation ratio depending on the amorphous structure. Therefore, it is desirable to form amorphous silicon having a low photodegradation ratio with a high open circuit voltage maintained which is a characteristic of amorphous silicon. However, it is generally difficult to form such amorphous silicon.

Further, the number of parameters to be controlled when a deposited film is formed in order to solve the first and second problems is large, and it is extremely difficult to determine the optimum range in which the characteristics are more excellent. More specifically, in the case of a method of forming a deposited film by plasma CVD, when, for example, in a solar cell having a structure in which two layers of a pin structure are stacked, that is, a so-called double structure, in order to attain conversion efficiency of about 10%, there is a certain extent of latitude in the combination of the respective parameters. Therefore, even if the conditions for forming the deposited film are not necessarily the optimum conditions, passable characteristics to function as an element can be obtained. However, when improvement of the conventional characteristics is attempted, it is extremely difficult to specify the conditions for forming the deposited film.

As a third problem, in order to improve independence from an apparatus, it is necessary to find a relationship which can be used when diverting the optimum conditions for forming the deposited film determined with an experimental apparatus for another apparatus with ease.

Conditions for forming a deposited film containing microcrystalline silicon or a deposited film substantially comprised of amorphous silicon include high frequency power, bias voltage, bias current, source gas flow rate, diluting gas flow rate, substrate temperature, pressure, and interelectrode distance. Because, generally, the conditions for forming a deposited film change much depending on the required characteristics of the deposited film, the structure of the deposited film forming apparatus, and the like, it is not easy to determine the optimum combination.

For example, in the case of a scale-up of the conditions for forming a deposited film determined with an experimental apparatus to those for a mass production apparatus, dimensions of the apparatus, such as the capacity of a space in which the deposited film is formed, the area of high frequency electrode, the position and the cross sectional area of an exhaust port, and the like are different. Therefore, if the conditions for forming the deposited film determined with the experimental apparatus are adopted as such for the mass production apparatus, although a certain extent of tendency or correlation can be grasped between the conditions for forming the deposited film and the characteristics of the deposited film, it is difficult to reproduce the characteristics as designed within a short period. More specifically, even if the conditions for forming a deposited film determined with the experimental apparatus are used as such, or after correction of the scale-up of the apparatus using a simple comparison expression, when a deposited film is actually formed with the mass production apparatus, the characteristics are not necessarily reproduced. As a result, it is necessary to determine again the optimum conditions using the mass production apparatus itself.

SUMMARY OF THE INVENTION

It is, therefore, an object of the present invention to provide a method of forming a deposited film which can optimize the conditions for forming a deposited film to strike a balance between the improvement in the conversion efficiency and the suppression of the photodegradation at a high level, and by which the optimum conditions for forming a deposited film determined with an experimental apparatus can be easily diverted for a manufacturing apparatus or the like.

It is another object of the present invention is to provide a method of forming a photovoltaic element which can drastically reduce the cost of manufacturing a photovoltaic element using a silicon-based deposited film.

To attain the above-mentioned objects of the present invention, according to a first aspect of the present invention, there is provided a method of forming a deposited film comprising microcrystalline silicon by plasma CVD, the method comprising changing at least one of conditions selected from a high frequency power density, a bias voltage with respect to an interelectrode distance, a bias current with respect to an electrode area, a high frequency power with respect to a source gas flow rate, a ratio of diluting gas flow rate to a source gas flow rate, a substrate temperature, a pressure, and an interelectrode distance, between conditions for forming a deposited film of a microcrystalline region and conditions for forming a deposited film of an amorphous region; and forming a deposited film under conditions within a predetermined range in the vicinity of boundary conditions under which the crystal system of the deposited film substantially changes between a amorphous state and a microcrystalline state.

According to a second aspect of the present invention, there is provided a method of forming a deposited film comprising microcrystalline silicon by plasma CVD, the method comprising changing at least one of conditions selected from a high frequency power density, a bias voltage with respect to an interelectrode distance, a bias current with respect to an electrode area, a high frequency power with respect to a source gas flow rate, a ratio of diluting gas flow rate to a source gas flow rate, a substrate temperature, a pressure, and an interelectrode distance, between conditions for forming a deposited film of a microcrystalline region and conditions for forming a deposited film of a region in which powder comprising silicon atoms is generated; and forming a deposited film under conditions within a predetermined range in the vicinity of boundary conditions under which powder comprising silicon atoms is generated.

According to the present invention, there is provided a method of forming a photovoltaic element comprising at least one unit element comprising a p-type layer, an i-type layer, and an n-type layer by plasma CVD, wherein the i-type layer is a substantially intrinsic deposited film comprising microcrystalline silicon; and the i-type layer is formed by the method of forming a deposited film according to the present invention.

Further features of the present invention will become apparent from the following description of exemplary embodiments with reference to the attached drawings.

DESCRIPTION OF THE EMBODIMENTS

Best mode for carrying out the present invention is now described in detail in the following with reference to the attached drawings, but the present invention is by no means limited thereto.

Figure 1:
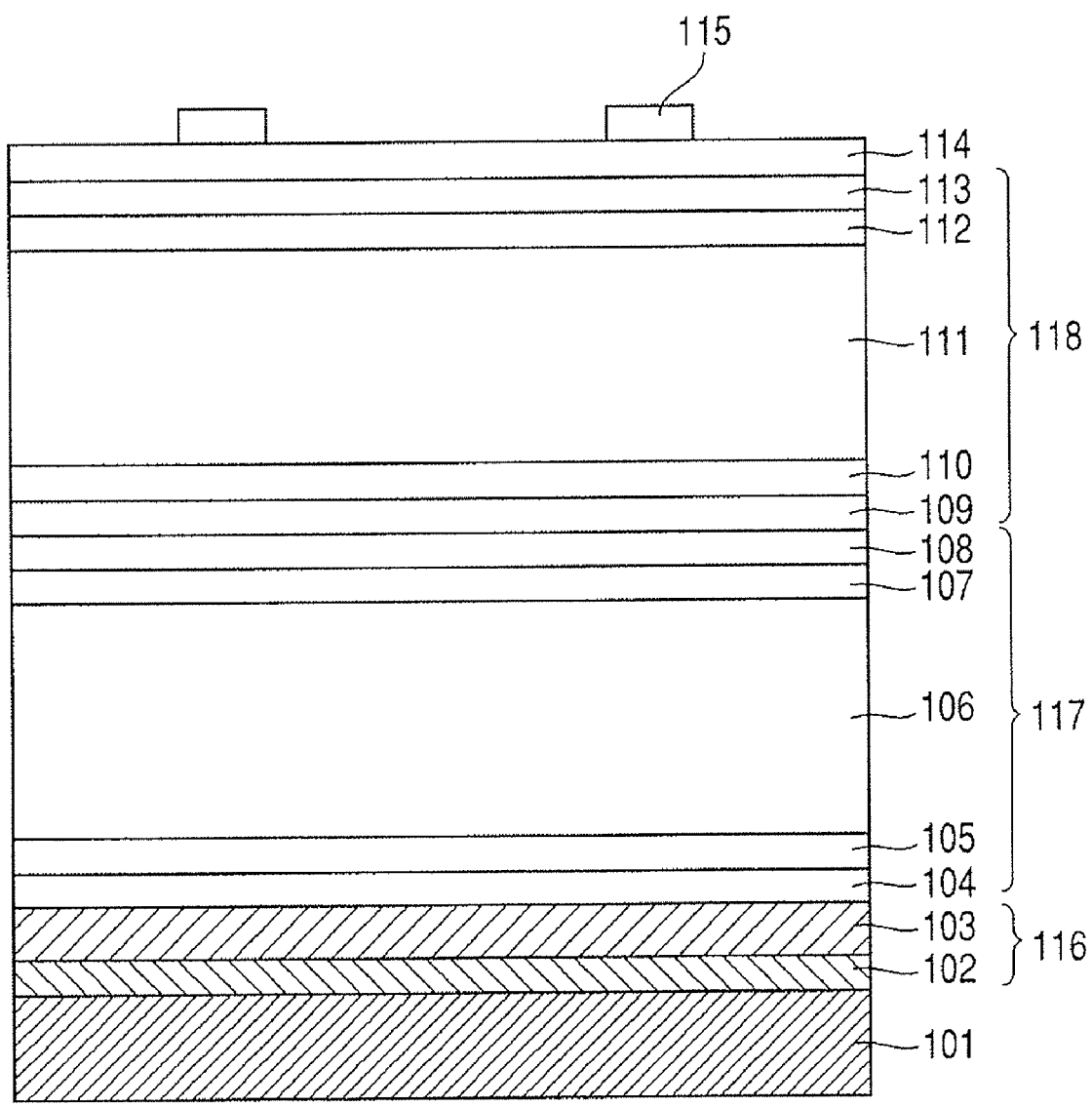
FIG. 1 is a cross-sectional view illustrating an exemplary layer structure of a solar cell formed according to the present invention.

FIG. 1 is a cross-sectional view illustrating an exemplary layer structure of a solar cell formed according to the present invention. In FIG. 1, reference numeral 101 denotes a substrate, 102 a reflecting layer, and 103 a reflection enhancing layer. The reflecting layer 102 and the reflection enhancing layer 103 form a rear surface reflecting layer 116. An n- or p-type layer 104, an n/i or p/i buffer layer 105, an i-type layer 106, a p/i or n/i buffer layer 107, and a p- or n-type layer 108 form a first photovoltaic element 117. An n- or p-type layer 109, an n/i or p/i buffer layer 110, an i-type layer 111, a p/i or n/i buffer layer 112, and a p- or n-type layer 113 form a second photovoltaic element 118. Reference numerals 114 and 115 denote a transparent electrode and a current collecting electrode, respectively.

In the present invention, by forming at least one of the above-mentioned i-type layers as an i-type layer comprising microcrystalline silicon formed under the conditions according to the present invention, a photovoltaic element whose characteristics are not degraded or less degraded by light irradiation over an extended period of time can be obtained. Further, by forming at least one of the above-mentioned i-type layers as an i-type layer substantially comprising amorphous silicon formed under the conditions according to the present invention, the layer thickness of the photovoltaic element can be made thinner and the voltage characteristics of the photovoltaic element can be improved.

Figure 7:
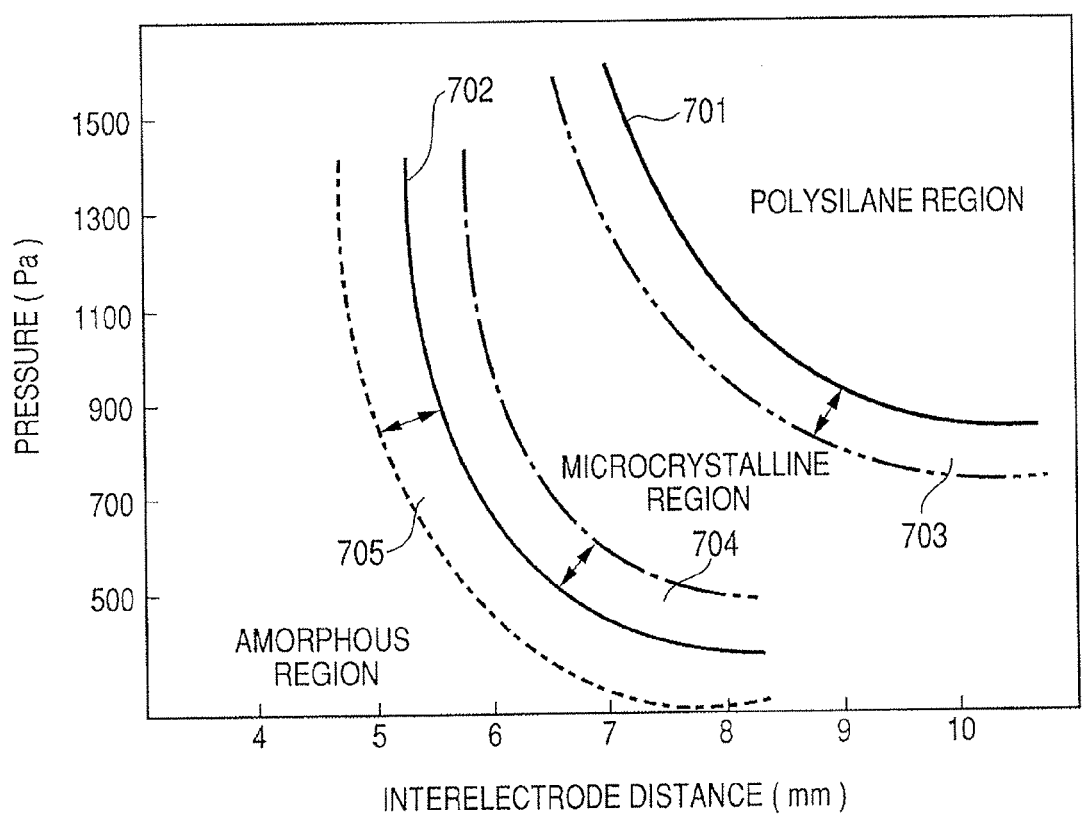
FIG. 7 is a graphical representation illustrating a crystal system of a deposited film when an interelectrode distance and a pressure at a time of forming the deposited film of conditions for forming the deposited film are changed.

FIG. 7 is a graphical representation illustrating a crystal system of a deposited film when an interelectrode distance and a pressure at a time of forming a deposited film of the conditions for forming the deposited film are changed. The term "crystal system of a deposited film" herein employed refers to the state of the deposited film. The term "state of the deposited film" refers to an amorphous state, a microcrystalline state, or a state in which powder of polysilane or the like is generated.

In FIG. 7, a line 701 is a boundary between a region in which powder of polysilane or the like containing silicon is generated (hereinafter referred to as "polysilane region") and a microcrystalline region. Here, the boundary between the polysilane region and the microcrystalline region refers to conditions such that when the conditions for forming a deposited film are changed and the deposited film is formed, powder of polysilane or the like containing silicon begins to be observed on or in the deposited film.

A line 702 is a boundary between the microcrystalline region and an amorphous region. Here, the boundary between the microcrystalline region and the amorphous region refers to conditions such that when the conditions for forming a deposited film are changed, the crystal structure of the deposited film is changed substantially from an amorphous structure to a microcrystalline structure. In the present invention, the conditions under which a crystal system is substantially changed are conditions such that when the conditions for forming a deposited film are changed, the ratio of a Raman scattering intensity due to a crystalline component of the deposited film to a Raman scattering intensity due to an amorphous component is changed from three or more to less than three. Further, according to the findings of the present inventors, the change in the ratio of the Raman scattering intensities under the boundary conditions is usually not gradual but is abrupt to some extent. Therefore, the above-mentioned boundary conditions are preferably such that the ratio of the Raman scattering intensity due to the crystalline component of the deposited film to the Raman scattering intensity due to the amorphous component is changed from three or more to one or less. When, in forming a photovoltaic element, the above-mentioned boundary conditions are defined in terms of the element characteristics, the conditions are such that both the open circuit voltage value and the short circuit current value of the photovoltaic element including a deposited film formed under the conditions for forming a deposited film according to the present invention are changed by 5% or more.

Reference numerals 703, 704, and 705 each denote a range of third conditions for forming a deposited film according to the present invention. More specifically, assuming that the conditions for forming a deposited film of the microcrystalline region are first conditions and the conditions for forming a deposited film of the polysilane region are second conditions, within the range of the first conditions, the range indicated/by reference numeral 703 which is in the vicinity of the boundary region indicated/by reference numeral 701 corresponds to the third conditions. The third conditions correspond to the conditions within the predetermined range according to the present invention. The same applies to the following description.

On the other hand, assuming that the conditions for forming a deposited film of the microcrystalline region are the first conditions and the conditions for forming a deposited film of the amorphous region are the second conditions, within the range of the first conditions, the range indicated/by reference numeral 704 which is in the vicinity of the boundary region indicated/by reference numeral 702 corresponds to the third conditions.

More specifically, of the conditions for forming a deposited film, the interelectrode distance and the pressure at the time of forming the deposited film are changed between the conditions for forming a deposited film of the microcrystalline region and the conditions for forming a deposited film of the amorphous region. At that time, the third conditions in the vicinity of the boundary conditions under which the crystal system of the above-mentioned deposited film is changed substantially between the amorphous state and the microcrystalline state are the conditions within the predetermined range according to the present invention.

Further, assuming that the conditions for forming a deposited film of the amorphous region are the first conditions and the conditions for forming a deposited film of the microcrystalline region are the second conditions, within the range of the first conditions, the range indicated/by reference numeral 705 in the vicinity of the boundary region indicated/by reference numeral 702 corresponds to the third conditions.

More specifically, of the conditions for forming a deposited film, the interelectrode distance and the pressure at the time of forming a deposited film are changed between the conditions for forming a deposited film of the microcrystalline region and the conditions for forming a deposited film of the region in which powder containing silicon atoms is generated. At that time, the third conditions under which powder containing silicon atoms is generated in the vicinity of the boundary conditions are the conditions within the predetermined range according to the present invention.

The third conditions according to the present invention are now described further in detail. Control parameters include (a) a high frequency power density, (b) a bias voltage with respect to an interelectrode distance, (c) a bias current with respect to an electrode area, (d) a high frequency power with respect to a source gas flow rate, (e) a ratio of a diluting gas flow rate to a source gas flow rate, (f) a substrate temperature, (g) a pressure, and (h) an interelectrode distance.

The third conditions are such that with the boundary conditions 701 or 702 being defined as a reference, at least one of the conditions selected from the above-mentioned control parameters (a) to (h) is changed within the range represented by the conditional equations: $0 < a \leq 0.5$ W/cm$^2$; $0 < b \leq 150$ V/cm; $0 < c \leq 0.3$ mA/cm$^2$; $0 < d \leq 3$ W/sccm; $0 < e \leq 10$; $0 < f \leq 20°$ C.; $0 < g \leq 200$ Pa; and $0 < h \leq 5$ mm.

It is more preferable that the selected parameter is changed within the range represented by the conditional equations: $0 < a \leq 0.3$ W/cm$^2$; $0 < b \leq 120$ V/cm; $0 < c \leq 0.2$ mA/cm$^2$; $0 < d \leq 2$ W/sccm; $0 < e \leq 8$; $0 < f \leq 10°$ C.; $0 < g \leq 100$ Pa; and $0 < h \leq 3$ mm.

It is most preferable that the selected parameter is changed within the range represented by the conditional equations: $0 < a \leq 0.2$ W/cm$^2$; $0 < b \leq 100$ V/cm; $0 < c \leq 0.1$ mA/cm$^2$; $0 < d \leq 1$ W/sccm; $0 < e \leq 5$; $0 < f \leq 5°$ C.; $0 < g \leq 50$ Pa; and $0 < h \leq 2$ mm.

Here, not all the above-mentioned control parameters are necessarily required to respectively satisfy the above-defined conditions at the same time. Even when any of the above-mentioned control parameters is changed without the above-defined range, if at least one of the parameters is controlled to fall within the above-defined range with the above-mentioned boundary conditions being the reference, the above-mentioned effects can be obtained.

Further, the range of change of the above-mentioned control parameters may be either in a positive direction or in a negative direction with respect to the value under the above-mentioned boundary conditions. For example, regarding the conditions for forming a deposited film containing microcrystalline silicon, it is essential that the range of the above-mentioned control parameters satisfies the conditions in the vicinity of the boundary conditions between the microcrystalline region and the polysilane region on the microcrystalline region side, or the conditions in the vicinity of the boundary conditions between the microcrystalline region and the amorphous region on the microcrystalline region side. As long as such conditions are satisfied, the change may be either in the positive direction or in the negative direction with respect to the value under the above-mentioned boundary conditions.

Similarly, regarding the conditions for forming a deposited film substantially comprised of amorphous silicon, for example, it is essential that the conditions in the vicinity of the boundary conditions between the amorphous region and the microcrystalline region on the amorphous region side are satisfied. As long as the conditions are satisfied, the change may be either in the positive direction or in the negative direction with respect to the value under the above-mentioned boundary conditions.

It is important that the above-mentioned parameters are controlled in the predetermined ranges with respect to the above-mentioned boundary conditions. The boundary conditions themselves may be changed depending on the conditions for forming a deposited film, the dimensions of a film forming apparatus, and the like. Therefore, it is important to check the boundary conditions according to the individual conditions for forming a deposited film or the apparatus.

When determining the above-mentioned boundary conditions, at least one of the above-mentioned parameters may be changed to decide the boundary conditions. However, as needed, a plurality of parameters may be changed to decide the boundary conditions. More specifically, for example, with reference to FIG. 7, the interelectrode distance is fixed to 4 mm and the pressure at the time of forming a deposited film is changed from 500 Pa to 1500 Pa to form a deposited film on a sample substrate, and the surface of the deposited film is observed and the Raman intensity ratio is measured for each sample. Then, the interelectrode distance is changed from 4 mm to 10 mm, and similarly, the surface of a deposited film is observed and the Raman intensity ratio is measured for each sample. After determining the boundary regions 701 and 702 in this way, when a deposited film containing microcrystals according to the present invention is formed, optimization is performed according to the required characteristics under the third conditions 703 or 704 in the above-mentioned first conditions (microcrystalline region).

Similarly, when a film substantially comprised of amorphous silicon is formed, optimization is performed according to the required characteristics under the third conditions 705 in the above-mentioned first conditions (amorphous region). This makes it possible to optimize with ease the conditions for forming a deposited film. For example, even when the optimum conditions determined with an experimental apparatus is diverted for a manufacturing apparatus of different dimensions, the optimum conditions for forming a deposited film can be set using the above-mentioned method.

More specifically, after scaling up the conditions for forming a deposited film determined with the experimental apparatus according to the scale of the manufacturing apparatus (for example, the volume of the film forming chamber, the area of the substrate, and the like), the boundary between the microcrystalline region and the amorphous region or the polysilane region is determined by a method similar to that described above. Then, within the range of the conditions in the vicinity of the boundary (the above-mentioned third conditions), optimization of the conditions is performed based on the tendency or the correlation between the conditions for forming the deposited film and the characteristics, which have been obtained with the experimental apparatus. This makes it possible to set with ease the optimum conditions for forming a deposited film with the manufacturing apparatus.

Further, by using the method according to the present invention, it becomes possible to strike a balance between the improvement in the conversion efficiency and the suppression of the photodegradation of a photovoltaic element such as a solar cell at a high level.

The reason for this effect is not certain, but the following assumption is made. Generally, as a problem that is generated when a silicon-based thin film containing microcrystals is simply adopted to an i-type semiconductor layer, a phenomenon that crystal boundaries affect both the majority carriers and the minority carriers to degrade the performance is known.

On the other hand, the crystal system of a deposited film (the state of the deposited film) formed by plasma CVD cannot be simply classified into a 100% amorphous state and a 100% microcrystalline state. In addition to these states, the crystal system can vary from a nearly amorphous state as a whole to a nearly microcrystalline state as a whole due to a complicated way of mixing of an amorphous component and a microcrystalline component.

It is considered that although such innumerable states can exist, in a deposited film in the vicinity of the above-mentioned boundary conditions, in addition to exhibition of the characteristics of microcrystals themselves existing in the deposited film, distortions and structural defects at the crystal boundaries between microcrystals are reduced.

This is considered because ion bombardment on a growth surface of the deposited film in a process of forming a deposited film contributes to the change in the crystal system from an amorphous state to a microcrystalline state. It is considered that within the range of the conditions for forming a deposited film according to the present invention, an effect is exhibited in which the above-mentioned ion bombardment is controlled to be within an appropriate range, so that the microcrystalline structure is not damaged to reduce the structural defects and the like. It is thought that this improves anti-photodegradation characteristics due to the crystal structure and, at the same time, increases photocurrent, and the characteristics when incorporated into a photovoltaic element are improved.

The best structure of the deposited film as described above also applies to a deposited film substantially comprised of amorphous silicon. It is considered that in a good-quality deposited film substantially comprised of amorphous silicon, as compared with a deposited film containing microcrystals, the above-mentioned ion bombardment acts relatively more positively to provide a dense amorphous structure with less structural defects.

It is considered that the above-mentioned deposited film containing microcrystalline silicon is a deposited film having excellent characteristics with crystal grains and crystal boundaries having less structural defects, and that the above-mentioned deposited film substantially comprised of amorphous is a dense deposited film having excellent characteristics with less structural defects.

The deposited film containing microcrystalline silicon or the deposited film substantially comprised of amorphous silicon can form an optimal element depending on the respective characteristics.

For example, when a photovoltaic element which is particularly excellent in anti-photodegradation characteristics and has a large current value is formed, it is preferable that a deposited film containing microcrystalline silicon according to the present invention be adopted as a photoactive layer of the photovoltaic element.

In the case of making thinner the layer thickness of a photovoltaic element to improve the voltage characteristics, it is preferable to adopt a deposited film substantially comprised of amorphous silicon according to the present invention as a photoactive layer of the photovoltaic element.

Further, it is also possible to combine a deposited film containing microcrystalline silicon according to the present invention and a deposited film substantially comprised of amorphous silicon according to the present invention to form a so-called double or triple or more stacked photovoltaic element.

The term "a deposited film containing microcrystalline silicon" herein employed refers to a deposited film which substantially contains crystalline silicon in a deposited film comprised of non-monocrystalline silicon, and a deposited film which partly contains amorphous silicon is also included therein. More specifically, it is a deposited film in which the ratio of a Raman scattering intensity due to a crystalline component of the deposited film to a Raman scattering intensity due to an amorphous component thereof is more than one. As long as such condition is satisfied, a deposited film containing so-called microcrystal silicon and polysilicon is also a deposited film containing microcrystalline silicon according to the present invention.

Regarding the Raman scattering intensity ratio in the Raman spectrum of the above-mentioned deposited film containing microcrystalline silicon, it is preferable that the Raman scattering intensity due to the crystalline component of the deposited film (typically about 520 cm$^{-1}$) is three times or more the Raman scattering intensity due to the amorphous component (typically about 480 cm$^{-1}$).

The average crystal grain diameter suitable for a microcrystalline semiconductor of a stacked photovoltaic element according to the present invention is within the range of 10 nm to 500 nm. Further, it is preferable that the i-type layer of the microcrystalline semiconductor have a columnar crystal structure.

Further, the term "a deposited film substantially comprised of amorphous silicon" refers to a deposited film which is comprised of non-monocrystalline silicon and which contains substantially no crystalline silicon therein, and a deposited film which partly contains crystalline silicon is also included therein. More specifically, it is a deposited film in which the ratio of a Raman scattering intensity due to a crystalline component to a Raman scattering intensity due to an amorphous component is less than one.

In the present invention, the pressure at the time of forming a deposited film is 100 Pa or more and 2000 Pa or less, preferably 150 Pa or more and 1800 Pa or less, and most preferably 300 Pa or more and 1500 Pa or less.

Further, in the present invention, the interelectrode distance is the distance between a high frequency electrode and an opposing electrode, and the substrate is allowed to also serve as the opposing electrode. The interelectrode distance is preferably 2 mm or more and 50 mm or less, more preferably 3 mm or more and 30 mm or less, and most preferably 5 mm or more and 20 mm or less.

Figure 2:
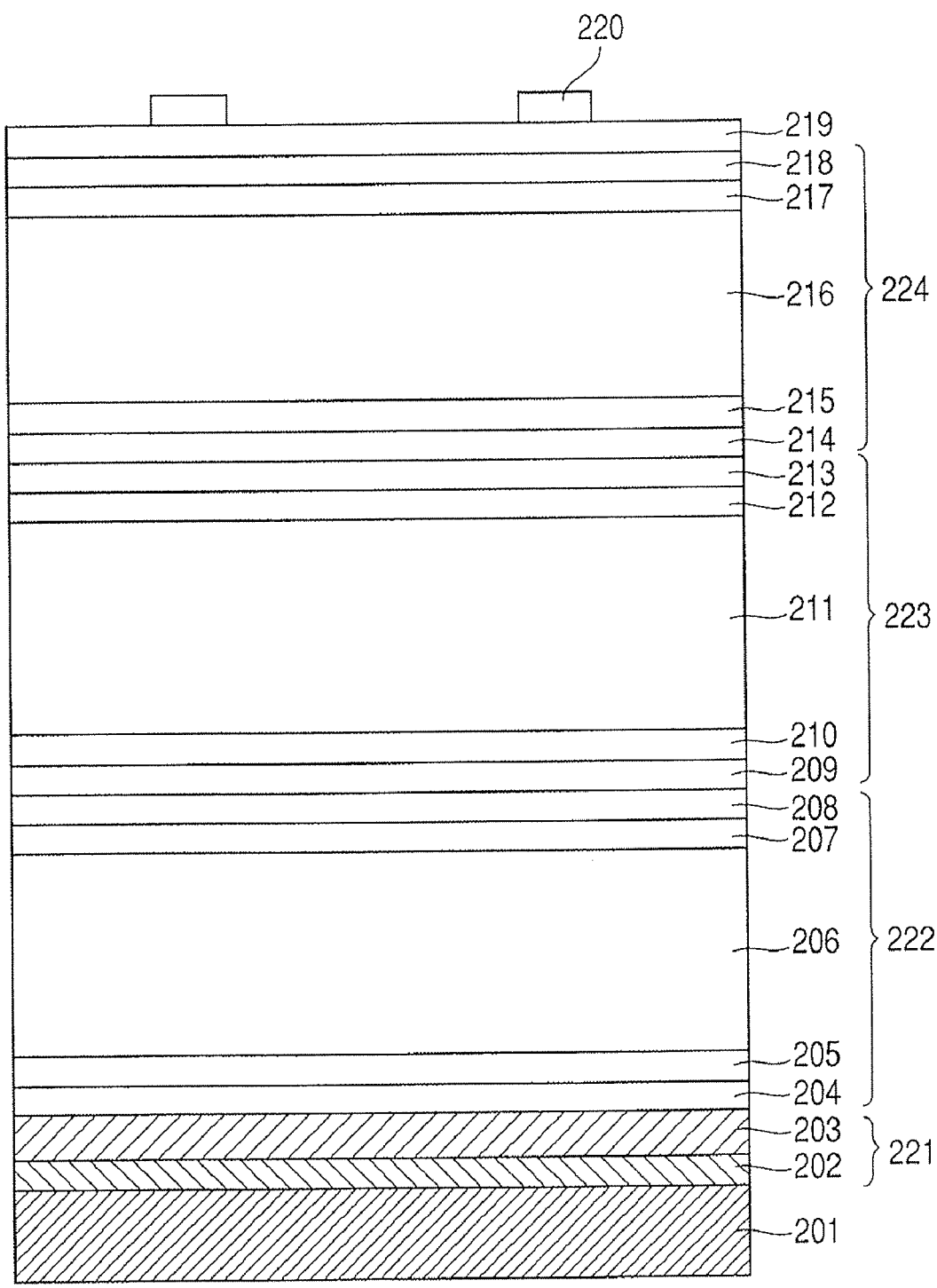
FIG. 2 is a cross-sectional view illustrating another exemplary layer structure of a solar cell formed according to the present invention.
Figure 3:
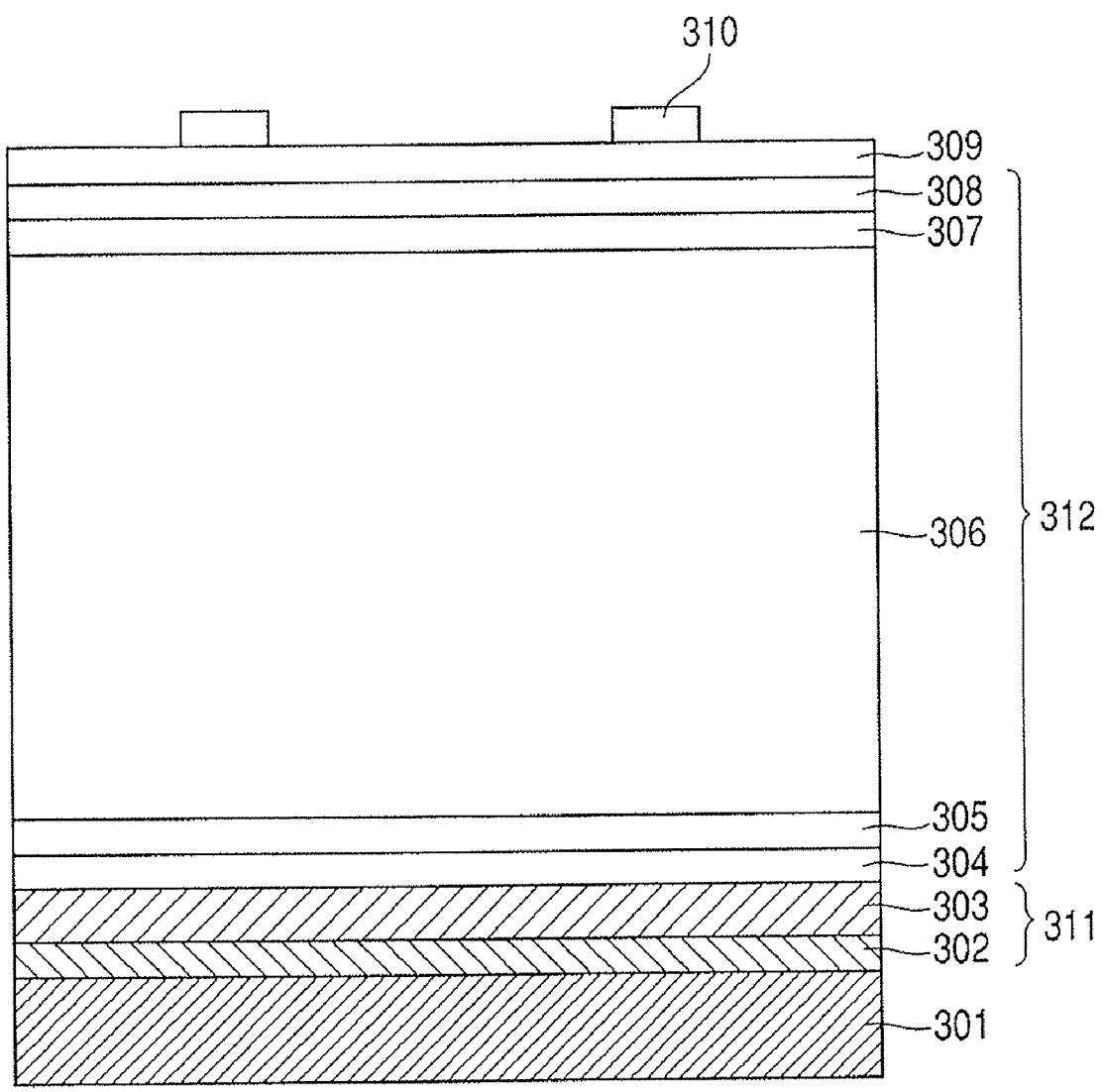
FIG. 3 is a cross-sectional view illustrating still another exemplary layer structure of a solar cell formed according to the present invention.
Figure 4:
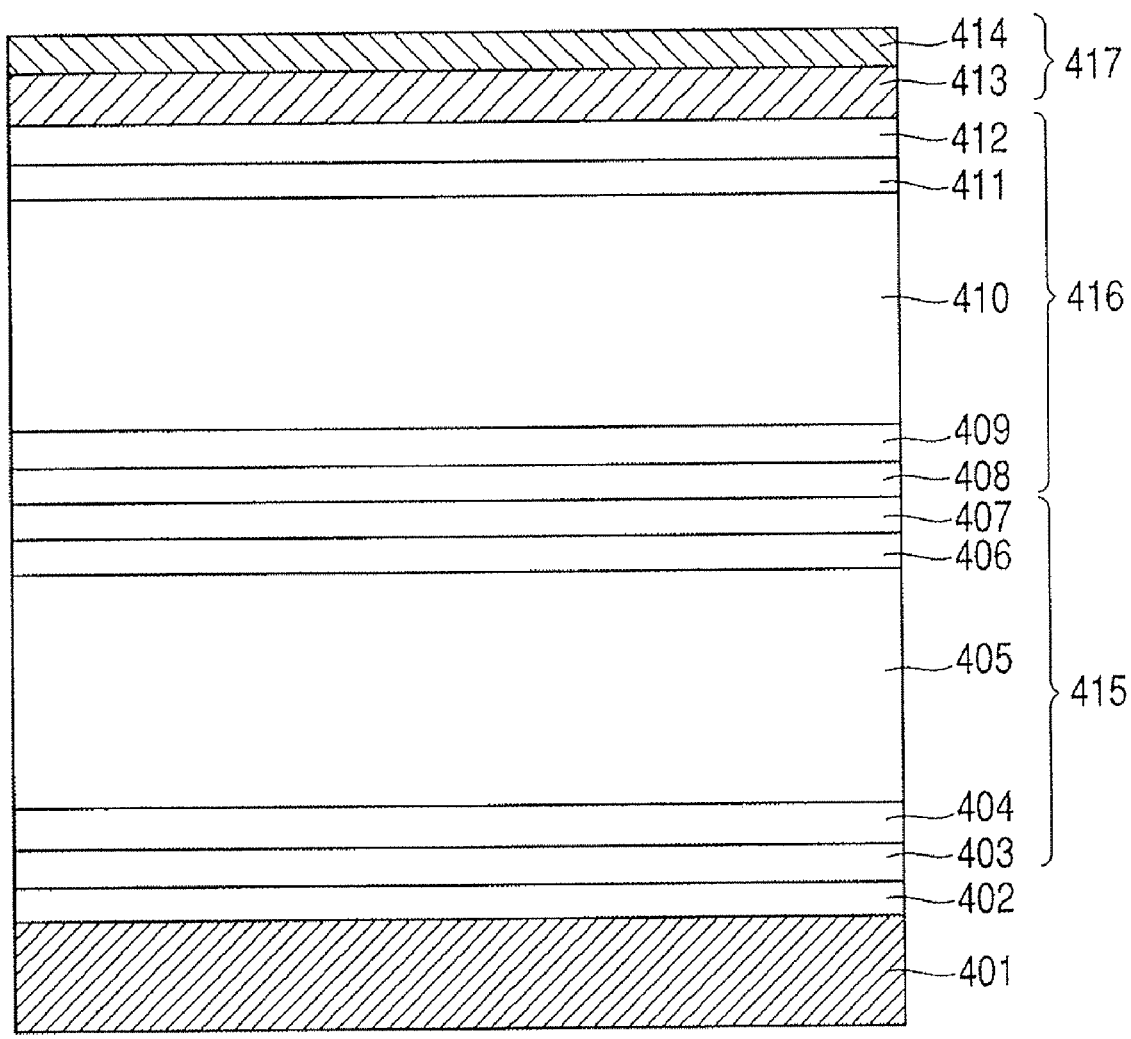
FIG. 4 is a cross-sectional view illustrating yet another exemplary layer structure of a solar cell formed according to the present invention.

In the present invention, the structure of the photovoltaic element is not limited to the double structure illustrated in FIG. 1, and, as shown as a triple structure, a single structure, and the like in FIGS. 2 to 4, the number of the layers may be increased or decreased as needed.

In FIG. 2, reference numeral 201 denotes a substrate, 202 a reflecting layer, and 203 a reflection enhancing layer. The reflecting layer 202 and the reflection enhancing layer 203 form a rear surface reflecting layer 221. An n- or p-type layer 204, an n/i or p/i buffer layer 205, an i-type layer 206, a p/i or n/i buffer layer 207, and a p- or n-type layer 208 form a first photovoltaic element 222. An n- or p-type layer 209, an n/i or p/i buffer layer 210, an i-type layer 211, a p/i or n/i buffer layer 212, and a p- or n-type layer 213 form a second photovoltaic element 223. An n- or p-type layer 214, an n/i or p/i buffer layer 215, an i-type layer 216, a p/i or n/i buffer layer 217, and a p- or n-type layer 218 form a third photovoltaic element 224. Reference numerals 219 and 220 denote a transparent electrode and a current collecting electrode, respectively.

In FIG. 3, reference numeral 301 denotes a substrate, 302 a reflecting layer, and 303 a reflection enhancing layer. The reflecting layer 302 and the reflection enhancing layer 303 form a rear surface reflecting layer 311. An n- or p-type layer 304, an n/i or p/i buffer layer 305, an i-type layer 306, a p/i or n/i buffer layer 307, and a p- or n-type layer 308 form a first photovoltaic element 312. Reference numerals 301 and 310 denote a transparent electrode and a current collecting electrode, respectively.

In FIG. 4, reference numerals 401 and 402 denote a light-transmissive substrate and a transparent electrode, respectively. A p- or n-type layer 403, a p/i or n/i buffer layer 404, an i-type layer 405, an n/i or p/i buffer layer 406, and an n- or p-type layer 407 form a first photovoltaic element 415. A p- or n-type layer 408, a p/i or n/i buffer layer 409, an i-type layer 410, an n/i or p/i buffer layer 411, and an n- or p-type layer 412 form a second photovoltaic element 416. A reflection enhancing layer 413 and a rear surface electrode 414 form a rear surface reflecting layer 417.

Figure 5:
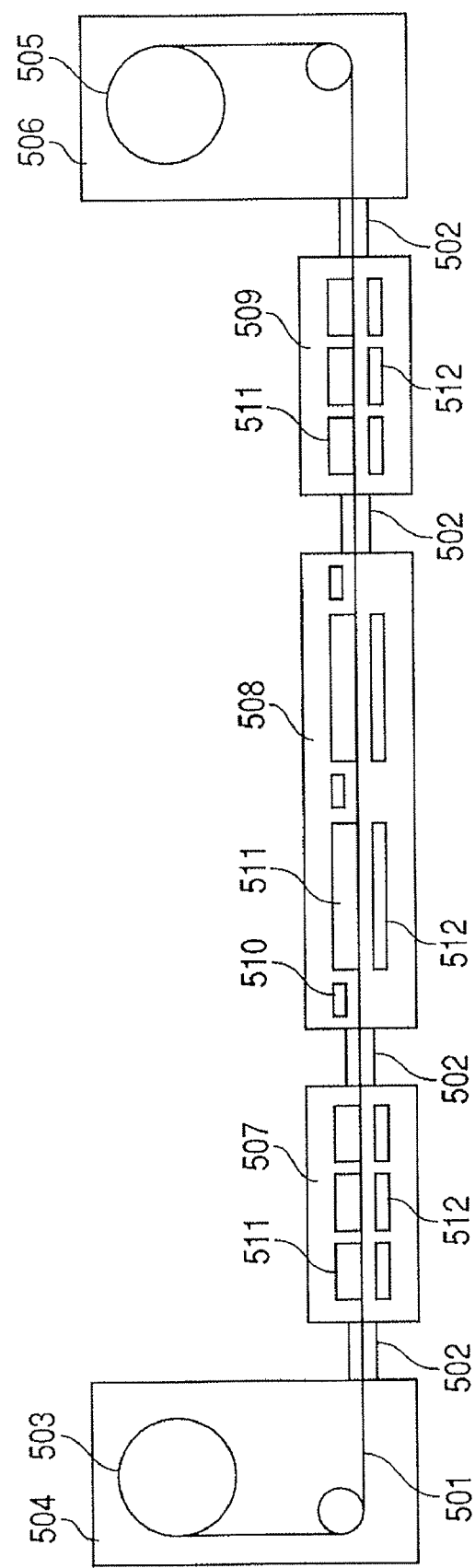
FIG. 5 is a schematic view illustrating an embodiment of a manufacturing apparatus used according to the present invention.
Figure 6:
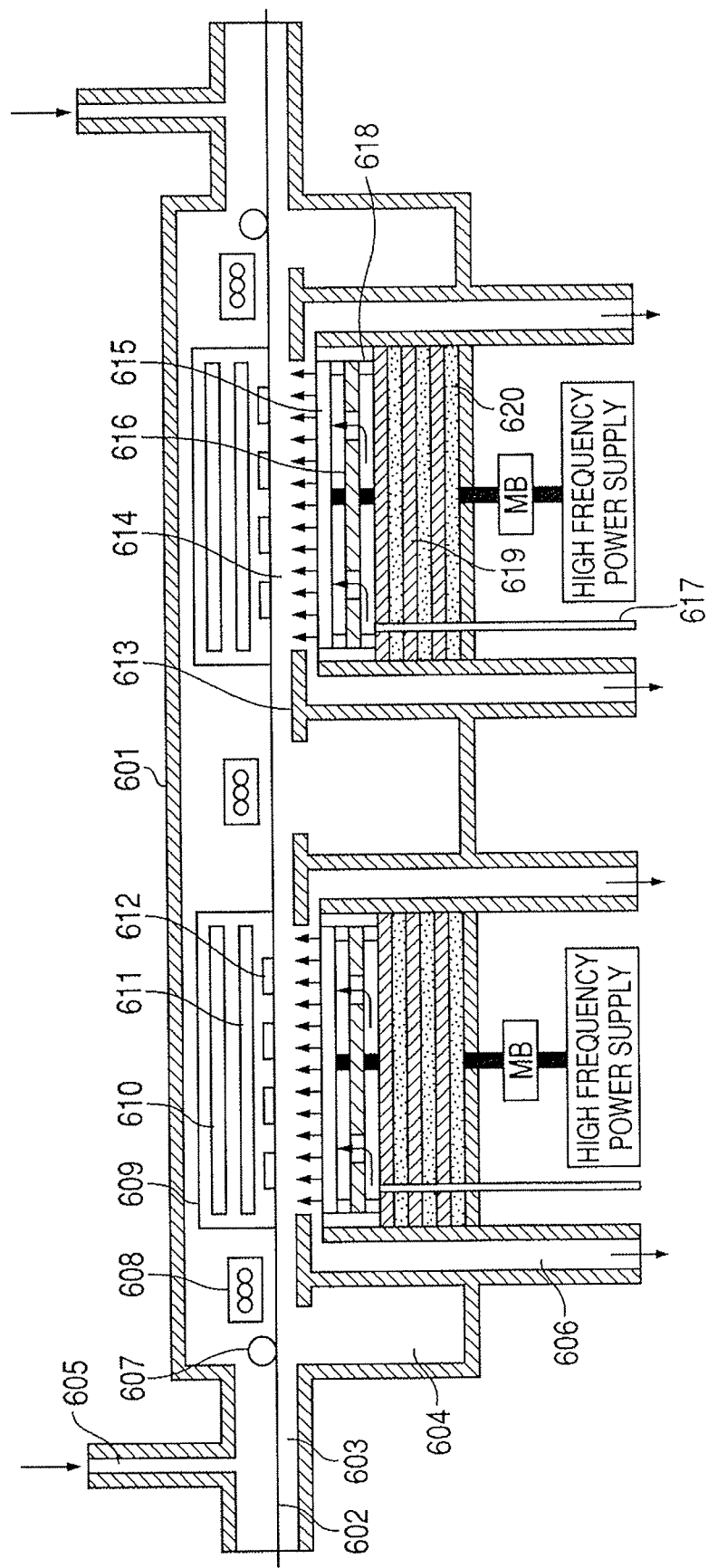
FIG. 6 is an enlarged view of an i-type layer forming chamber.

Next, a method of forming a deposited film according to the present invention is described with reference to FIGS. 5 and 6. FIG. 5 is a schematic view illustrating an embodiment of a manufacturing apparatus for carrying out the present invention. FIG. 6 is an enlarged view of an i-type layer forming chamber. Here, although FIGS. 5 and 6 illustrate a deposited film forming apparatus of a roll-to-roll system, the present invention is not limited to such a roll-to-roll system and is also effective in a deposited film forming apparatus of a batch system or a single substrate system.

In FIG. 5, reference numeral 501 denotes a substrate, 502 a gas gate, 503 a wind off bobbin, 504 a wind off chamber, 505 a wind up bobbin, and 506 a wind up chamber. Further, reference numeral 507 denotes an n-type layer forming chamber, 508 an i-type layer forming chamber, 509 a p-type layer forming chamber, 510 a preheater, 511 a temperature control unit, and 512 a cathode (high frequency electrodes).

In FIG. 6, reference numeral 601 denotes an i-type layer forming chamber, 602 a substrate, 603 a gas gate, 604 a first vacuum vessel, 605 a gate gas introducing pipe, and 606 an exhaust port. Further, reference numeral 607 denotes a magnetic roller, 608 a lamp heater, 609 a temperature control unit, 610 a cooling means, and 611 a heating means. Moreover, reference numeral 612 denotes a magnet, 613 an opening adjusting plate, 614 a second vacuum vessel (electric discharge space), 615 a shower head cathode, 616 a middle plate, 617 a source gas introducing pipe, 618 an insulator, 619 a floating plate, and 620 a dielectric plate.

The terms "sccm" and "slm" herein employed as units for gas flow rates of a source gas, a diluting gas, and the like are intended to mean "1 cm$^3$/min (normal)" and "1000 cm$^3$/min (normal)", respectively.

First, a stainless steel substrate 501 having a reflecting layer and a reflection enhancing layer formed thereon using an apparatus for forming a reflecting layer and a reflection enhancing layer (not shown) is wound off from the wind off bobbin 503 in the wind off chamber 504. Then, the substrate 501 is set through the gas gates 502, the n-type layer forming chamber 507, the i-type layer forming chamber 508, and the p-type layer forming chamber 509 and set onto the wind up bobbin 505 in the wind up chamber 506. Then, air in the wind off chamber 504, the wind up chamber 506, and the layer forming chambers 507 to 509 is exhausted from exhaust ports (not shown) such that the pressure therein is 1×10$^{-4}$ Pa or less, for example. Next, gate gas (for example, hydrogen, helium, or the like) is made to flow from the gas gates 502 while desired source gases are introduced into the respective layer forming chambers 507 to 509 at a desired flow rate from gas introducing pipes (not shown) provided in the layer forming chambers. At the same time, in the respective layer forming chambers 507 to 509, the substrate 501 is heated to a desired temperature by the preheater 510 and the temperature control units 511. In the layer forming chambers, when the source gas flow rate, the substrate temperature, the pressure, and the like satisfy predetermined conditions, high frequency power is input to the cathodes 512 from a high frequency power supply (not shown) to generate plasma. Then, by moving the substrate 501 from the wind off chamber 504 side to the wind up chamber 506 side, an n-type layer, an i-type layer, and a p-type layer are deposited in sequence on the substrate 501 to form a pin structure.

Then, using a vapor deposition apparatus for depositing a transparent electrode (not shown), a transparent electrode is deposited in a desired thickness on the p-type layer. Similarly, a current collecting electrode is deposited on the transparent electrode.

Here, film formation in the respective layer forming chambers 507 to 509 is described in further detail with reference to FIG. 6 taking the i-type layer forming chamber as an example. The gas gates 603 are connected to the both ends of the i-type layer forming chamber 601. The gate gas introducing pipe 605 is provided for each of the gas gates 603 such that a gate gas such as hydrogen, helium, or an inert gas is introduced through the gate gas introducing pipe. The gate gas has a function of suppressing gas mixture between adjacent layer forming chambers. The inside of the i-type layer forming chamber is a double structure in which the second vacuum container 614 for generating high frequency plasma is provided in the first vacuum container 604. The shower head cathode 615 which serves both as a high frequency electrode and as a gas introducing pipe is disposed in the second vacuum container. A high frequency power supply is connected to the shower head cathode 615 via a matching box. The first vacuum container 604 and the second vacuum container 614 are partly separated from each other by a partition wall. The wall facing the substrate 602 of the walls which constitute the second vacuum container 614 is provided with the opening adjusting plate 613 such that the region where plasma generated in the second vacuum container 614 is brought into contact with the substrate can be controlled.

On the other hand, the substrate 602 in the i-type layer forming chamber 601 is supported by the magnetic rollers 607 and the temperature control units 609 provided in the i-type layer forming chamber. The temperature control unit 609 has the cooling means 610 and the heating means 611 provided therein. Further, by providing the magnets 612 on the side of a surface which comes into contact with the substrate 602, the temperature control unit 609 and the substrate 602 are structured so as to be in thermal and electrical contact with each other, and thus, the temperature control and the potential control (controlled to be at ground potential) of the substrate are carried out while the substrate is supported. The shower head cathode 615 has a plurality of gas ejection holes provided in the cathode surface for dispersion/introduction of gas. The middle plate 616 having gas through holes provided therein is disposed in the shower head cathode 615 for the purpose of dispersing the gas uniformly. By this, the source gas introduced from the gas introducing pipe 617 into the shower head cathode 615 passes through the gas ejection holes provided at the surface of the shower head cathode 615 after being dispersed by the middle plate 616, and is introduced into the second vacuum container (electric discharge space) 614. The floating plates 619 and the dielectric plates 620 comprised of a metallic material are stacked below the shower head cathode between the shower head cathode and the outer wall of the i-type layer forming chamber 601. This adjusts the impedance of the shower head cathode 615 and suppresses generation of abnormal electric discharge in the space between the shower head cathode 615 and the i-type layer forming chamber 601. Thus, high frequency power is efficiently transmitted to the shower head cathode 615. The side surfaces of the shower head cathode 615 are structured to be shielded by the insulators 618 and conductive wall surfaces surrounding the insulators. Further, gases introduced from the shower head cathode 615 and the gas gates 603 into the i-type layer forming chamber 601 are exhausted from the exhaust ports 606.

It is to be noted that, although the above description is in the context of the structure formed of the single n-type layer forming chamber 507, the single i-type layer forming chamber 508, and the single p-type layer forming chamber 509, the number of the respective film forming chambers may be increased as needed to constitute an apparatus for forming a stacked photovoltaic element having a desired number of stacks such as a double or triple stacked photovoltaic element. Further, in addition to the above-mentioned film forming chambers, an n/i or p/i buffer layer forming chamber may be used as needed.

Next, structural components of the photovoltaic element according to the present invention are described in detail.

(Substrate and Reflecting Layer)

As the substrate used in the photovoltaic element according to the present invention, a metallic substrate such as of stainless steel, in particular, a ferrite-based stainless steel substrate is preferable. Further, as the material for an insulating substrate, glass, ceramic, and the like are preferable.

In the case of an insulating substrate, it is necessary to deposit a metal, a transparent conductive film, or the like on the insulating substrate to thereby make the insulating substrate conductive. When a light transmissive substrate such as glass is used and a transparent conductive film is deposited on the substrate to form a photovoltaic element, light can be incident not only from the semiconductor side but also from the light transmissive substrate side.

Treatment to make the insulating substrate conductive may be to deposit a metallic element such as Al, Ag, or Cu or an alloy thereof as a reflecting layer. The thickness of the reflecting layer is required to be more than such a thickness as to provide the reflectivity of the metal itself.

In order to form the reflecting layer such that the surface thereof is as flat as possible, it is preferable to form the reflecting layer in a thickness of several ten nanometers to 300 nm at a relatively low temperature. Alternatively, in order to form the reflecting layer such that the surface thereof has unevenness, it is preferable to form the reflecting layer in a thickness of more than 300 nm and several micrometers or less.

(Reflection Enhancing Layer)

It is desirable to provide a reflection enhancing layer for increasing the amount of light absorbed in the semiconductor layer on the above-mentioned metallic substrate or reflecting layer. The most preferable range of the thickness of the reflection enhancing layer is between 100 nm and 5000 nm.

The reflection enhancing layer functions to increase irregular reflection of incident light and reflected light to thereby make larger the optical path in the semiconductor layer. Further, the reflection enhancing layer has a role of preventing an element of the reflecting layer from being diffused or migrated into the semiconductor layer, thereby preventing occurrence of shunt in the photovoltaic element. Further, the reflection enhancing layer has an appropriate resistance and therefore has a role of preventing occurrence of short circuit due to a defect such as a pinhole in the semiconductor layer. Further, it is desirable that the surface of the reflection enhancing layer has unevenness as is the case with the reflecting layer. It is preferable that the reflection enhancing layer is made of a conductive oxide such as indium oxide, tin oxide, zinc oxide, or indium tin oxide (ITO) and is formed by using a method such as vapor deposition, sputtering, CVD, or electrodeposition. Further, those forming methods may be used in appropriate combination. A substance which changes the electrical conductivity may be added to those conductive oxides. When the reflection enhancing layer is formed, a method is preferably used which forms the reflection enhancing layer at a lower rate in a region in contact with the reflecting layer. Further, it is also preferable that, in the region in contact with the reflecting layer, oxygen is contained in the forming atmosphere.

When the reflecting layer and the reflection enhancing layer are formed by sputtering, the specific method, the species and the flow rate of the gas, the internal pressure, the input electric power, the film forming rate, the substrate temperature, and the like have a large influence. For example, when a zinc oxide film is formed using a zinc oxide target by DC magnetron sputtering, examples of the gas include Ar, Ne, Kr, Xe, Hg, and $O_2$. The gas flow rate depends on the size of the apparatus and the exhaust rate, and when the capacity of the film forming space is 20 L, for example, it is desirable that the gas flow rate is 1 sccm to 100 sccm. It is desirable that the internal pressure when the film is formed is 10 mPa to 10 Pa. The input electric power depends on the size of the target, and when the target diameter is 15 cm, it is desirable that the input electric power is 10 W to 10 kW. The suitable range of the substrate temperature differs depending on the film forming rate, and when the film is formed at 1 µm/h, it is desirable that the substrate temperature is 70° C. to 450° C.

When a zinc oxide film is formed by electrodeposition, it is preferable to use an aqueous solution containing nitrate ions and zinc ions in a corrosion-resistant vessel. The concentrations of the nitrate ions and the zinc ions are each preferably within a range of 0.001 mol/L to 1.0 mol/L, more preferably within a range of 0.01 mol/L to 0.5 mol/L, and most preferably within a range of 0.1 mol/L to 0.25 mol/L. The supply sources of the nitrate ions and the zinc ions are not particularly limited, and may be zinc nitrate which is a supply source of the both kinds of ions, and may be a mixture of a water-soluble nitrate which is a supply source of the nitrate ions such as ammonium nitrate and a zinc salt which is a supply source of the zinc ions such as zinc sulfate. Further, it is also preferable to add a carbohydrate to those aqueous solutions in order to suppress abnormal growth and to improve the adhesion. The kind of the carbohydrate is not particularly limited, and a monosaccharide such as glucose (grape sugar) or fructose (fluit suger), a disaccharide such as maltose (malt suger) or saccharose (cane sugar), a polysaccharide such as dextrin or starch or a mixture thereof may be used.

Further, in order to control the crystal grain diameter, the tilt angle, and the like of the zinc oxide film, phthalic acid, isophthalic acid, maleic acid, naphthalic acid, an ester thereof, or the like can be appropriately added. The concentration of those polyvalent carboxylic acids is preferably from 0.5 µmol/L to 500 µmol/L, more preferably 50 µmol/L to 500 µmol/L, and most preferably 150 µmol/L to 500 µmol/L. By controlling the concentration of the polyvalent carboxylic acid in this way, a zinc oxide film having a texture structure suitable for attaining a light trapping effect can be formed efficiently.

The amount of the carbohydrate in the aqueous solution depends on the kind of the carbohydrate, and preferably within a range of approximately 0.001 g/L to 300 g/L, more preferably within a range of 0.005 g/L to 100 g/L, and most preferably within a range of 0.01 g/L to 60 g/L. When the zinc oxide film is deposited by electrodeposition, it is preferable to use a substrate on which the zinc oxide film is to be deposited in the above-mentioned aqueous solution as a cathode and also to use zinc, platinum, carbon, or the like as an anode. Here, it is preferable that the density of current which flows through a load resistance is from 10 mA/dm to 10 A/dm.

(p-type Layer and n-type Layer)

The p-type layer or n-type layer is a major layer which has an influence on the characteristics of a photovoltaic device. Examples of the amorphous material, and the microcrystalline and polycrystalline materials of the p-type layer or n-type layer include materials obtained by adding in a high concentration a p-type valency controller (such as B, Al, Ga, In, and Tl that are Group III atoms of Periodic Table) or an n-type valency controller (such as P, As, Sb, and Bi that are Group V atoms of Periodic Table) to a-Si:H, a-Si:HX, a-SiC:H, a-SIC: HX, a-SiGe:H, a-SiGeC:H, a-SiO:H, a-SiN:H, a-SiON:HX, a-SiOCN:HX, μc-Si:H, μc-SiC:H, μc-Si:HX, μc-SiC:HX, μc-SiGe:H, μc-SiO:H, μc-SiGeC:H, μc-SiN:H, μc-SiON:HX, μc-SiOCN:HX, poly-Si:H, poly-Si:HX, poly-SiC:H, poly-SiC:HX, poly-SiGe:H, poly-Si, poly-SiC, poly-SiGe, and the like.

In particular, as the p-type layer or the n-type layer on the light incident side, a crystalline semiconductor layer with less light absorption or an amorphous semiconductor layer with a large bandgap is suitable.

The most preferable amount of Group III atoms of Periodic Table to be added to the p-type layer and the most preferable amount of Group V atoms of Periodic Table to be added to the n-type layer are each 0.1 to 50 atomic %.

Further, hydrogen atoms (H, D) or halogen atoms to be contained in the p-type layer or the n-type layer has a role of compensating for the dangling bonds in the p-type layer or the n-type layer to thereby improve the doping efficiency of the p-type layer or the n-type layer. The most preferable amount of hydrogen atoms or halogen atoms added to the p-type layer or the n-type layer is 0.1 to 40 atomic %. In particular, when the p-type layer or the n-type layer is crystalline, the most preferable amount of hydrogen atoms or halogen atoms is 0.1 to 8 atomic %.

Further, a preferable depth profile of the hydrogen atoms and/or the halogen atoms is that there are distributed more hydrogen atoms and/or halogen atoms on the side of the p-type layer/i-type layer interface and the n-type layer/i-type layer interface. It is preferable that the concentration of hydrogen atoms and/or halogen atoms in the vicinity of the interface is 1.1 to 2 times that in the bulk. Thus, by making larger the amount of hydrogen atoms or halogen atoms in the vicinity of the p-type layer/i-type layer interface and of the n-type layer/i-type layer interface, defect levels and mechanical distortion in the vicinity of the interface can be reduced, and the photovoltage and photocurrent of the stacked photovoltaic element according to the present invention can be increased.

Regarding the electric characteristics of the p-type layer and the n-type layer of the photovoltaic element, the activation energy is preferably 0.2 eV or less, and most preferably 0.1 eV or less. Further, the resistivity is preferably 100 Ωcm or less, and most preferably 1 Ωcm or less. Moreover, the thickness of the p-type layer and the n-type layer is preferably 1 to 50 nm, and most preferably 3 to 10 nm.

The source gas suitable for deposition of the p-type layer or the n-type layer of the photovoltaic element may be a gasifiable compound containing silicon atoms, a gasifiable compound containing germanium atoms, a gasifiable compound containing carbon atoms, a gas which is a mixture of the gases of those compounds, or the like.

Examples of the gasifiable compound containing silicon atoms include $SiH_4$, $SiH_6$, $SiF_4$, $SiFH_3$, $SiF_2H_2$, $SiF_3H$, $Si_3H_8$, $SiD_4$, $SiHD_3$, $SiH_2D_2$, $SiH_3D$, $SiFD_3$, $SiF_2D_2$, $SiD_3H$, and $Si_2D_3H_3$.

Examples of the gasifiable compound containing germanium atoms include $GeH_4$, $GeD_4$, $GeF_4$, $GeFH_3$, $GeF_2H_2$, $GeF_3H$, $GeHD_3$, $GeH_2D_2$, $GeH_3D$, $GeH_6$, and $GeD_6$.

Examples of the gasifiable compound containing carbon atoms include $CH_4$, $CD_4$, $CnH_{2n+2}$ (n is an integer), $CnH_{2n}$ (n is an integer), $C_2H_2$, $C_6H_6$, $CO_2$, and CO.

Examples of the nitrogen-containing gas include $N_2$, $NH_3$, $ND_3$, NO, $NO_2$, and $N_2O$.

Examples of the oxygen-containing gas include $O_2$, CO, $CO_2$, NO, $NO_2$, $N_2O$, $CH_3CH_2OH$, and $CH_3OH$.

Examples of the material which is introduced into the p-type layer or the n-type layer for valency control include Group III atoms and Group V atoms of Periodic Table.

As starting materials for introducing Group III atoms, there can be effectively used, for introducing boron atoms, boron hydrides such as $B_2H_6$, $B_4H_{10}$, $B_5H_9$, $B_5H_{11}$, $B_6H_{10}$, $B_6H_{12}$, and $B_6H_{14}$, and boron halides such as $BF_3$ and $BCl_3$. Other examples of such starting materials include $AlCl_3$, $GaCl_3$, $InCl_3$, and $TlCl_3$. $B_2H_6$ and $BF_3$ are particularly preferable.

As starting materials for introducing Group V atoms, there can be effectively used, for introducing phosphorus atoms, phosphorous hydrides such as $PH_3$ and $P_2H_4$, and phosphorous halides such as $PH_4I$, $PF_3$, $PF_5$, $PCl_3$, $PCl_5$, $PBr_3$, $PBr_5$, and $PI_3$. Other examples of such starting materials include $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, and $BiBr_3$. $PH_3$ and $PF_3$ are particularly preferable.

The method of depositing the p-type layer or the n-type layer suitable for the photovoltaic element may be RF plasma CVD, VHF plasma CVD, microwave plasma CVD, or the like. In particular, when the deposition is performed by RF plasma CVD or VHF plasma CVD, capacitive coupling type plasma CVD is suitable. The most preferable conditions for depositing the p-type layer or the n-type layer by RF plasma CVD or VHF plasma CVD are such that the substrate temperature in the deposition chamber is 100 to 350° C., the internal pressure is 10 to 2000 Pa, the RF or VHF power is 0.01 to 5.0 W/cm$^2$, and the deposition rate is 0.1 to 10 nm/sec.

Further, the above-mentioned gasifiable compound may be appropriately diluted with a gas such as $H_2$, He, Ne, Ar, Xe, Kr, or the like and introduced into the deposition chamber.

In particular, when a layer with less light absorption or with a large bandgap such as a microcrystalline semiconductor or a-SiC:H is to be deposited, it is preferable to dilute the source gas to 2-100 times volume with hydrogen gas and to introduce a relatively high RF and VHF power. In the present invention, the range of the RF frequency is preferably 1 MHz to 30 MHz with a frequency in the vicinity of 13.56 MHz being optimal. Further, the range of the VHF frequency is preferably 30 MHz to 500 MHz, more preferably 40 MHz to 450 MHz, and most preferably 50 MHz to 400 MHz.

When the p-type layer or the n-type layer is deposited by microwave plasma CVD, a method of introducing microwave into a deposition chamber by a waveguide via a dielectric window (alumina ceramic or the like) is preferable. When the p-type layer or the n-type layer is deposited by microwave plasma CVD, although the method of forming a deposited film according to the present invention is a preferable depositing method, a deposited film applicable to a photovoltaic element can be formed under broader depositing conditions.

When the p-type layer or the n-type layer is deposited by microwave plasma CVD, it is preferable that the substrate temperature in the deposition chamber is 100 to 400° C., the internal pressure is 0.05 to 300 Pa, the microwave power is 0.01 to 1 W/cm$^3$, and the microwave frequency is 0.5 to 10 GHz.

Further, the above-mentioned gasifiable compound may be appropriately diluted with a gas such as $H_2$, He, Ne, Ar, Xe, Kr, or the like and introduced into the deposition chamber.

In particular, when a layer with less light absorption or with a large bandgap such as a microcrystalline semiconductor or a-SiC:H is deposited, it is preferable to dilute the source gas to 2-100 times volume with hydrogen gas and to introduce a relatively high microwave power.

(Microcrystalline i-type Layer)

Preferable methods of depositing the film containing microcrystalline silicon of the photovoltaic element according to the present invention include RF plasma CVD, VHF plasma CVD, microwave plasma CVD, and the like. In particular, the deposition rate of the microcrystalline silicon depends on an electromagnetic wave used, and, when the input energy is the same, the higher the frequency, the larger the deposition rate.

Examples of the source gas for supplying silicon atoms suitable for microcrystalline silicon include silane-based source gases such as $SiH_4$, $Si_2H_6$, $SiF_4$, $SiHF_3$, $SiH_2F_2$, $SiH_3F$, $SiH_3Cl$, $SiH_2Cl_2$, $SiHCl_3$, $SiCl_4$, $SiD_4$, $SiHD_3$, $SiH_2D_2$, $SiH_3D$, $SiFD_3$, $SiF_2D_2$, $SiD_3H$, and $Si_2D_3H_3$.

Examples of the source gas for supplying germanium atoms suitable for microcrystalline silicon-germanium include $GeH_4$, $GeF_4$, $GeHF_3$, $GeH_2F_2$, $GeH_3F$, $GeHCl_3$, $GeH_2Cl_2$, $GeH_3Cl$, $GeHD_3$, $GeH_2D_2$, $GeH_3D$, $GeH_6$, and $GeD_6$ In order to form good microcrystalline semiconductor, the source gas needs to be diluted with hydrogen gas. The dilution ratio is preferably 10:1 or more, and more preferably within the range of 10:1 to 100:1. When the dilution ratio is too small, microcrystals are not formed and amorphous semiconductor is formed. On the other hand, when the dilution ratio is too large, the deposition rate of the microcrystals becomes too small, which poses a practical problem. Further, in addition to dilution with hydrogen, dilution with helium gas is also possible.

The substrate temperature for forming microcrystals suitable for the present invention is 100° C. to 500° C. In particular, when the deposition rate is made higher, it is desirable to set the substrate temperature at a relatively high temperature.

The pressure in the chamber when microcrystals according to the present invention are deposited is preferably 100 Pa to 2000 Pa in a case where the microcrystalline semiconductor is deposited by VHF plasma CVD, and is preferably 0.05 Pa to 300 Pa in a case where the microcrystalline semiconductor is deposited by microwave plasma CVD.

The power input to the chamber when the microcrystalline semiconductor according to the present invention is deposited is preferably within the range of 0.01 to 10 $W/cm^2$. Regarding the relationship between the flow rate of the source gas and the input power, when the characteristics of the deposited film is considered to be important, a power limited region where the deposition rate depends on the input power is suitable, while, when the gas utilization efficiency is considered to be important, a flow limited region where the deposition rate depends on the flow rate of the introduced gas is suitable.

Further, in the deposition of the microcrystalline semiconductor according to the present invention, the distance between the substrate and the electrode for power input is an important factor. The interelectrode distance at which a microcrystalline semiconductor suitable for the present invention is obtained is within the range of 2 mm to 50 mm.

The average crystal grain diameter suitable for the microcrystalline semiconductor of the stacked photovoltaic element according to the present invention is preferably within the range of 10 nm to 500 nm. Further, regarding the ratio of the amorphous semiconductor contained in the microcrystalline semiconductor, it is preferable in terms of the Raman spectrum that the ratio of the Raman scattering intensity due to the crystalline component of the deposited film to the Raman scattering intensity due to the amorphous component is three or more.

When the average crystal grain diameter is less than 10 nm, the amount of the amorphous component existing at the crystal grain boundaries becomes larger, and photodegradation is exhibited. Further, when the crystal grain diameter is small, the mobility of electrons and holes become smaller and the life of electrons and holes becomes shorter, and the characteristics as a semiconductor are lowered. On the other hand, when the average crystal grain diameter is more than 500 nm, the relaxation of the crystal boundaries does not proceed well, and thus, defects such as dangling bonds are generated at the crystal grain boundaries. The defects play a role of recombination centers of electrons and holes, and as a result, the characteristics of the microcrystalline semiconductor are lowered.

Further, it is preferable that the microcrystals each have an elongated shape along the direction of movement of electric charge. In addition, the content of the hydrogen atoms or the halogen atoms contained in the microcrystals according to the present invention is preferably 30% or less.

In a photovoltaic element, an i-type layer is an important layer which generates carriers in response to irradiated light and transports them. As the i-type layer, a slightly p-type or a slightly n-type layer may be used (whether the layer is p-type or n-type depends on the distribution of intrinsic defects such as tail state).

As the i-type layer of the photovoltaic element according to the present invention, a semiconductor having a uniform bandgap is preferable. In addition, a layer is also preferable which contains silicon atoms and germanium atoms with the bandgap being gradually changed in the thickness direction of the i-type layer and with a minimum value of the bandgap being offset toward the interface between a p-type layer and the i-type layer with respect to the center of the i-type layer. Further, an i-type layer having both a valence electron controller as a donor and a valence electron controller as an acceptor doped therein is also preferable.

In particular, a depth profile where the content of hydrogen atoms and/or halogen atoms distributed on the side of the p-type layer/i-type layer interface and on the side of the n-type layer/i-type layer interface is large is preferable. The content of hydrogen atoms and/or halogen atoms in the vicinity of the interfaces is preferably 1.1 to 2 times as that in the bulk. Further, it is preferable that the content of hydrogen atoms and/or halogen atoms is changed corresponding to the content of silicon atoms. The content of hydrogen atoms and/or halogen atoms in a region where the content of silicon atoms is the smallest is preferably within the range of 1 to 10 atom %, and is preferably within the range of 0.3 to 0.8 times that in a region where the content of hydrogen atoms and/or halogen atoms is the largest.

The content of hydrogen atoms and/or halogen atoms is changed corresponding to the content of silicon atoms. More particularly, corresponding to the bandgap, the content of hydrogen atoms and/or halogen atoms is smaller in a region where the bandgap is smaller.

The detailed mechanism is unclear but is considered as follows. According to the method of forming a deposited film of the present invention, in the deposition of an alloy semiconductor containing silicon atoms and germanium atoms, due to the difference in the ionization rate between the silicon atoms and the germanium atoms, the electromagnetic wave energy obtained by the respective atoms differ from each other. As a result, in the alloy semiconductor, the relaxation proceeds enough even when the content of hydrogen atoms and/or halogen atoms is small, so that a good-quality alloy semiconductor can be deposited.

The thickness of the i-type layer greatly depends on the structure (e.g., a single cell structure, a tandem cell structure or a triple cell structure) of the photovoltaic element, and on the bandgap of the i-type layer, but is most preferably within the range of 0.7 to 30.0 µm.

The i-type layer containing silicon atoms or germanium atoms according to the method of forming a deposited film of the present invention has a small tail state on the valence band side even when the deposition rate is raised to 2 nm/sec or more, and the gradient of the tail state is 60 meV or less. In addition, the density of dangling bonds measured by electron spin resonance (ESR) is $10^{17}/cm^3$ or less.

Further, it is preferable that the bandgap of the i-type layer is designed to be larger on the side of the p-type layer/i-type layer interface and on the side of the n-type layer/i-type layer interface. Such design can increase the photovoltage and photocurrent of the photovoltaic element, and further, occurrence of photodegradation and the like when used for a long period of time can be prevented.

When the characteristics of the microcrystalline semiconductor are to be further improved, it is preferable that the bias is so controlled as to prevent ions from colliding with the substrate more than necessary.

(Amorphous i-type Layer)

In the present invention, a stacked photovoltaic element of a unit element having a pin junction including an i-type layer containing microcrystalline silicon and a unit element having a pin junction including an i-type layer containing amorphous silicon can be formed as needed. In this case, methods suitable for depositing the amorphous silicon include RF plasma CVD, VHF plasma CVD, microwave plasma CVD, and the like. In particular, the deposition rate of the amorphous silicon depends on an electromagnetic wave used, and, when the input energy is the same, the higher the frequency is, the higher the deposition rate becomes.

Examples of the source gas for supplying silicon atoms suitable for amorphous silicon include silane-based source gases such as $SiH_4$, $Si_2H_6$, $SiF_4$, $SiHF_3$, $SiH_2F_2$, $SiH_3F$, $SiH_3Cl$, $SiH_2Cl_2$, $SiHCl_3$, $SiCl_4$, $SiD_4$, $SiHD_3$, $SiH_2D_2$, $SiH_3D$, $SiFD_3$, $SiF_2D_2$, $SiD_3H$, and $Si_2D_3H_3$.

Examples of the source gas for supplying germanium atoms suitable for amorphous silicon-germanium include $GeH_4$, $GeF_4$, $GeHF_3$, $GeH_2F_2$, $GeH_3F$, $GeHCl_3$, $GeH_2Cl_2$, $GeH_3Cl$, $GeHD_3$, $GeH_2D_2$, $GeH_3D$, $GeH_6$, and $GeD_6$.

In order to form good amorphous semiconductor, the source gas needs to be diluted with hydrogen gas, and the dilution ratio is preferably 5:1 or more. The particularly preferable range of the dilution ratio is 5:1 to 50:1. Further, in addition to dilution with hydrogen, dilution with helium gas is also possible.

The substrate temperature for forming the amorphous semiconductor suitable for the present invention is 100° C. to 500° C. In particular, when the deposition rate is made higher, it is desirable to set the substrate temperature at a relatively high temperature.

The pressure inside the chamber when the amorphous semiconductor according to the present invention is deposited is preferably within the range of 0.05 Pa to 500 Pa. In particular, when the amorphous semiconductor is deposited by VHF plasma CVD, the pressure is preferably 50 Pa to 300 Pa. When the amorphous semiconductor is deposited by microwave plasma CVD, the pressure is preferably 0.1 Pa to 10 Pa.

The power input to the chamber when the amorphous semiconductor according to the present invention is deposited is preferably within the range of 0.01 to 5 W/cm². Regarding the relationship between the flow rate of the source gas and the input power, when the characteristics of the deposited film is considered to be important, a power limited region where the deposition rate depends on the input power is suitable, while, when the gas utilization efficiency is considered to be important, a flow limited region where the deposition rate depends on the flow rate of the introduced gas is suitable.

When the deposition rate of the amorphous semiconductor is required to be made higher, it is preferable to control the bias such that ions collide with the substrate.

In addition, the ratio of the hydrogen atoms or the halogen atoms contained in the amorphous semiconductor according to the present invention is preferably within the range of 5 to 30%.

In a photovoltaic element, an i-type layer is an important layer which generates carriers in response to irradiated light and transports them. As the i-type layer, a slightly p-type or a slightly n-type layer may be used (whether the layer is p-type or n-type depends on the distribution of intrinsic defects such as tail state).

As the i-type layer of the stacked photovoltaic element according to the present invention, a semiconductor having a uniform bandgap is preferable. In addition, a layer is also preferable which contains silicon atoms and germanium atoms with the bandgap being gradually changed in the thickness direction of the i-type layer and with a minimum value of the bandgap being offset toward the interface between a p-type layer and the i-type layer with respect to the center of the i-type layer. Further, an i-type layer having both a valence electron controller as a donor and a valence electron controller as an acceptor doped therein is also preferable.

In particular, a depth profile where the content of hydrogen atoms and/or halogen atoms distributed on the side of the p-type layer/i-type layer interface and on the side of the n-type layer/i-type layer interface is large is preferable. The content of hydrogen atoms and/or halogen atoms in the vicinity of the interfaces is preferably 1.1 to 2 times as that in the bulk. Further, it is preferable that the content of hydrogen atoms and/or halogen atoms is changed corresponding to the content of silicon atoms. The content of hydrogen atoms and/or halogen atoms in a region where the content of silicon atoms is the smallest is preferably within the range of 1 to 10 atomic %, and is preferably within the range of 0.3 to 0.8 times that in a region where the content of hydrogen atoms and/or halogen atoms is the largest. When both hydrogen atoms and halogen atoms are contained, it is preferable that the content of halogen atoms is 1/10 or less of the content of hydrogen atoms.

The content of hydrogen atoms and/or halogen atoms is changed corresponding to the content of silicon atoms. More particularly, corresponding to the bandgap, the content of hydrogen atoms and/or halogen atoms is smaller in a region where the bandgap is smaller.

The detailed mechanism is unclear but is considered as follows. According to the method of forming a deposited film of the present invention, in the deposition of an alloy semiconductor containing silicon atoms and germanium atoms, due to the difference in the ionization rate between the silicon atoms and the germanium atoms, the electromagnetic wave energy obtained by the respective atoms differ from each other. As a result, in the alloy semiconductor, the relaxation proceeds enough even when the content of hydrogen atoms and/or halogen atoms is small, so that a good-quality alloy semiconductor can be deposited.

The thickness of the i-type layer greatly depends on the structure (e.g., a single cell structure, a tandem cell structure or a triple cell structure) of the photovoltaic element, and on the bandgap of the i-type layer, but is most preferably within the range of 0.05 to 10 μm.

The i-type layer containing silicon atoms or germanium atoms according to the method of forming a deposited film of the present invention has a small tail state on the valence band side even when the deposition rate is raised to 2 nm/sec or more, and the gradient of the tail state is 60 meV or less. In addition, the density of dangling bonds measured by electron spin resonance (ESR) is $5 \times 10^{17}/cm^3$ or less.

Further, it is preferable that the bandgap of the i-type layer is designed to be larger on the side of the p-type layer/i-type layer interface and the n-type layer/i-type layer interface. Such design can increase the photovoltage and photocurrent of the photovoltaic element, and further, occurrence of photodegradation and the like when used for a long period of time can be prevented.

(Transparent Electrode)

As the transparent electrode, a transparent electrode such as of indium oxide or indium tin oxide is preferable. For deposition of the transparent electrode, sputtering and vacuum vapor deposition are most preferably employed. With a DC magnetron sputtering apparatus, when a transparent electrode comprised of indium oxide is deposited on a substrate, metallic indium (In), indium oxide ($In_2O_3$), or the like is used as the target.

Further, when a transparent electrode comprised of indium tin oxide is deposited on a substrate, metallic tin, metallic indium, an alloy of metallic tin and metallic indium, tin oxide, indium oxide, indium tin oxide, and the like are used in appropriate combination and as the target.

When the deposition is performed by sputtering, the substrate temperature is an important factor, and its preferable range is 25° C. to 600° C. As the sputtering gas, inert gas such as argon gas (Ar), neon gas (Ne), xenon gas (Xe), or helium gas (He) may be used, and, in particular, Ar gas is most preferable. Further, it is preferable to add oxygen gas ($O_2$) as needed to the above-mentioned inert gas. In particular, when the target is a metal, it is indispensable to add oxygen gas ($O_2$).

Further, for the purpose of effectively performing sputtering with the above-mentioned inert gas, it is preferable that the pressure inside an electric discharge space is within the range of 0.05 Pa to 10 Pa. In addition, as the power supply for the sputtering, a DC power supply and an RF power supply are preferable, and the electric power during the sputtering is preferably within the range of 10 to 1000 W.

The deposition rate of the transparent electrode depends on the pressure inside the electric discharge space and the discharge power, and the deposition rate is most preferably within the range of 0.01 to 10 nm/sec.

The transparent electrode is deposited preferably in such a layer thickness as to satisfy the conditions of an antireflective film, and more specifically, the layer thickness is preferably within the range of 50 to 300 nm.

As vapor deposition sources suitable for depositing the transparent electrode by vacuum vapor deposition, there are included metallic tin, metallic indium, indium-tin alloy, and the like.

Moreover, the substrate temperature when depositing the transparent electrode is preferably within the range of 25° C. to 600° C.

Further, when the transparent electrode is deposited, it is necessary to reduce the pressure inside the deposition chamber to $10^{-4}$ Pa or less and then to introduce oxygen gas ($O_2$) at a pressure of $5 \times 10^{-3}$ Pa to $9 \times 10^{-2}$ Pa. By introducing oxygen at a pressure within such a range, metal vaporized from the vapor deposition source reacts with oxygen in the vapor phase to deposit a good transparent electrode.

Further, RF electric power may be introduced at the above-mentioned pressure to generate plasma and vapor deposition may be performed utilizing the plasma.

The deposition rate of the transparent electrode under the above-mentioned conditions is preferably within the range of 0.01 to 10 nm/sec. This is because, when the deposition rate is less than 0.01 nm/sec, the productivity is lowered, while, when the deposition rate is more than 10 nm/sec, the film becomes coarse, and the transmittance, the conductivity, and the adhesion thereof are decreased.

(Current Collecting Electrode)

In the present invention, when the resistivity of the transparent electrode 114 can not be sufficiently lowered, the current collecting electrode 115 is formed as needed on a part of the transparent electrode 114 to lower the resistivity of the electrode and to lower the series resistance of the photovoltaic element.

The material of the current collecting electrode may be a metal such as gold, silver, copper, aluminum, nickel, iron, chromium, molybdenum, tungsten, titanium, cobalt, tantalum, niobium, or zirconium. Alternatively, the material of the current collecting electrode may be an alloy such as stainless steel or a conductive paste using powdery metal. The current collecting electrode is formed in a comb shape so as not to shield incident light on the semiconductor layer as far as possible.

Further, the ratio of the area occupied by the current collecting electrode to the area of the whole photovoltaic device is preferably 15% or less, more preferably 10% or less, and most preferably 5% or less.

The current collecting electrode is patterned using a mask. As the method of forming the current collecting electrode, there is used vapor deposition, sputtering, plating, printing, or the like.

Incidentally, when a photovoltaic device which outputs desired voltage and current using the stacked photovoltaic element according to the present invention is manufactured, the photovoltaic elements according to the present invention are connected in series or in parallel, protective layers are formed on the front surface and the rear surface, respectively, and electrodes for extracting an output and the like are attached. Further, when the photovoltaic elements according to the present invention are connected in series, a diode for preventing current backflow may be incorporated as need.

EXAMPLES

Examples of the present invention are now described in further detail, but the present invention is by no means limited by these examples.

Example 1

A belt-shaped base member (40 cm in width, 200 m in length, and 0.125 mm in thickness) made of stainless steel (SUS430BA) was sufficiently degreased and cleaned, and then mounted to a continuous sputtering apparatus (not shown). An Ag thin film was vapor deposited in a thickness of 100 nm by sputtering using an Ag electrode as a target. Further, a ZnO thin film was vapor deposited in a thickness of 1.2 μm on the Ag thin film by sputtering using a ZnO target to thereby form a belt-shaped conductive substrate 501.

Then, the apparatus of the structure illustrated in FIG. 5 was used to deposit an n-type semiconductor layer, an i-type semiconductor layer, and a p-type semiconductor layer in sequence from the substrate side according to the above-mentioned procedure under the conditions in Table 1 with the pressure and the interelectrode distance during formation of the i-type layer being changed. After that, using a sputtering apparatus and a vapor deposition apparatus (not shown), a transparent conductive ITO film having a thickness of 80 nm was deposited by sputtering as a front surface electrode 114 on the n-i-p photoelectric conversion unit. By depositing thereon a comb-shaped Ag electrode 115 for current extraction by vapor deposition, samples of a solar cell (single cell) having a pin structure illustrated in FIG. 3 were formed.

At this time, the thickness of the n-type layer was 20 nm, the thickness of an n/i buffer layer was 10 nm, the thickness of a p/i buffer layer was 10 nm, and the thickness of the p-type layer was 5 nm.

When the above-mentioned i-type layer was formed in a microcrystalline region or a polysilane region described later, the thickness of the i-type layer was 1500 nm, while when the above-mentioned i-type layer was formed in an amorphous silicon region described later, the thickness of the i-type layer was 200 nm. Because the most preferable film thickness differs between a deposited film containing microcrystalline silicon and a deposited film substantially comprised of amorphous silicon based on the difference in characteristics such as electric characteristics and optical characteristics when they function as photovoltaic elements, the layer thickness was appropriately adjusted for performing appropriate evaluation depending on the crystal system.

Incidentally, in Table 1, "RF" as high frequency power is intended to mean RF electric power having a frequency of 13.56 MHz, while "VHF" means VHF electric power having a frequency of 60 MHz. Further, as "bias voltage", a negative potential with respect to ground potential is applied to a high frequency electrode.

TABLE 1

|  | n-type layer | n/i buffer layer | i-type layer | p/i buffer layer | p-type layer |
|---|---|---|---|---|---|
| Gas species and flow rate |  |  |  |  |  |
| SiH$_4$ (sccm) | 30 | 15 | 500 | 50 | 50 |
| SiF$_4$ (sccm) |  |  | 200 |  |  |
| H$_2$ (sccm) | 3600 | 4000 | 10000 | 400 | 15000 |
| PH$_3$ (%) | 5 |  |  |  |  |
| BF$_3$ (%) |  |  |  |  | 30 |
| Bias voltage (V) | 0 | 0 | −60 | 0 | 0 |
| Substrate temperature (° C.) | 220 | 250 | 200 | 220 | 150 |
| Pressure (Pa) | 1000 | 1000 | 500 to 1500 | 1000 | 1000 |
| High frequency power (kW) | 0.2 (RF) | 1.2 (VHF) | 5 (VHF) | 0.2 (RF) | 1.5 (RF) |
| Interelectrode distance (mm) | 10 | 15 | 4 to 10 | 15 | 10 |
| Film thickness (nm) | 20 | 10 | 200/1500 | 10 | 5 |

With regard to the respective samples formed, photoelectric conversion efficiency, short circuit current (Jsc), open circuit voltage (Voc), and fill factor were measured using a solar simulator (AM 1.5; 100 mW/cm$^2$). After that, with the respective samples maintained at 50° C., light irradiation was carried out for 1000 hours with the spectrum being AM 1.5 and the light intensity being 1 sun. The respective characteristics of the samples after the light irradiation were measured similarly to those before the light irradiation, and the photo-degradation ratio was determined.

With regard to the i-type layer, apart from the solar cell samples having the above-mentioned pin structure, samples in which only the i-type layer was formed on the substrate under the same conditions shown in Table 1 were formed.

The surfaces of the formed samples having only the i-type layer were observed with SEM to confirm whether polysilane was generated or not.

Further, with regard to the samples having only the i-type layer, the ratio of the Raman scattering intensity due to the crystalline component of the deposited film to the Raman scattering intensity due to the amorphous component was determined by measuring the Raman spectrum.

The results are shown in FIG. 7 and Table 2.

Here, FIG. 7 is a graphical representation illustrating the crystal system of the deposited film described above. Considering the state of polysilane generation observed with SEM in the samples having only the i-type layer, conditions under which there are twenty or more polysilane particles with a diameter of 10 μm or more per 1 cm$^2$ of the surface of the sample were defined as the polysilane region. Then, the boundary 701 between the polysilane region and the microcrystalline region was determined.

On the other hand, with regard to the samples having only the i-type layer, conditions under which the ratio of the Raman scattering intensity due to the crystalline component to the Raman scattering intensity due to the amorphous component was three or more were defined as the microcrystalline region. Further, conditions under which the value of the above ratio was less than three were defined as the amorphous region, based on which the boundary 702 between the microcrystalline region and the amorphous region was determined.

The symbols in Table 2 show the following contents.

Jsc (Short Circuit Current): (in the Case of Microcrystalline Region/Polysilane Region)
□: 25 mA/cm$^2$ or more
○: 20 mA/cm$^2$ or more and less than 25 mA/cm$^2$
Δ: 15 mA/cm$^2$ or more and less than 20 mA/cm$^2$
x: less than 15 mA/cm$^2$ or immeasurable Jsc (Short Circuit Current): (in the Case of Amorphous Region)
□: 9 mA/cm$^2$ or more
○: 7 MA/Cm$^2$ or more and less than 9 mA/cm$^2$
Δ: 5 mA/cm$^2$ or more and less than 7 mA/cm$^2$
x: less than 5 mA/cm$^2$ or immeasurable Voc (Open Circuit Voltage): (in the Case of Microcrystalline Region/Polysilane Region)
□: 0.5 V or more
○: 0.4 V or more and less than 0.5 V
Δ: 0.3 V or more and less than 0.4 V
x: less than 0.3 V or immeasurable Voc (Open Circuit Voltage): (in the Case of Amorphous Region)
□: 0.9 V or more
○: 0.7 V or more and less than 0.9 V
Δ: 0.5 V or more and less than 0.7 V
x: 0.5 V or more or immeasurable FF (Fill Factor): (in the Case of Microcrystalline Region/Polysilane Region)
□: 0.5 or more
○: 0.4 or more and less than 0.5
Δ: 0.3 or more and less than 0.4
x: less than 0.3 or immeasurable FF (Fill Factor): (in the Case of Amorphous Region)
□: 0.7 or more
○: 0.6 or more and less than 0.7
Δ: 0.5 or more and less than 0.6
x: less than 0.5 or immeasurable
  η (Photoelectric Conversion Efficiency)
□: 7% or more
○: 6% or more and less than 7%
Δ: 5% or more and less than 6%
x: less than 5% or immeasurable
  Photodegradation Ratio
□: less than 5%
○: 5% or more and less than 7%
Δ: 7% or more and less than 10%
x: 10% or more or immeasurable

TABLE 2

| Pressure | | Interelectrode distance | | | | | | |
|---|---|---|---|---|---|---|---|---|
| | | 4 mm | 5 mm | 6 mm | 7 mm | 8 mm | 9 mm | 10 mm |
| 500 Pa | Voc | ○ | ○ | □ | □ | □ | ○ | Δ |
| | Jsc | Δ | Δ | ○ | □ | □ | ○ | ○ |
| | FF | Δ | Δ | ○ | □ | □ | ○ | ○ |
| | η | Δ | Δ | ○ | □ | □ | ○ | ○ |
| | Photo-degradation ratio | Δ | Δ | ○ | □ | □ | □ | ○ |
| 700 Pa | Voc | ○ | ○ | ○ | ○ | ○ | ○ | Δ |
| | Jsc | Δ | Δ | □ | □ | ○ | ○ | ○ |
| | FF | Δ | Δ | □ | □ | ○ | ○ | ○ |
| | η | Δ | ○ | □ | ○ | ○ | ○ | Δ |
| | Photo-degradation ratio | Δ | Δ | □ | □ | ○ | □ | ○ |
| 900 Pa | Voc | ○ | □ | □ | ○ | ○ | ○ | Δ |
| | Jsc | Δ | □ | □ | ○ | □ | ○ | ○ |
| | FF | Δ | □ | □ | ○ | ○ | ○ | ○ |
| | η | ○ | □ | □ | ○ | □ | □ | Δ |
| | Photo-degradation ratio | Δ | ○ | □ | ○ | □ | □ | ○ |
| 1100 Pa | Voc | ○ | □ | □ | ○ | □ | Δ | x |
| | Jsc | ○ | □ | □ | □ | □ | ○ | Δ |
| | FF | Δ | □ | □ | ○ | □ | Δ | x |
| | η | ○ | □ | □ | ○ | □ | Δ | x |
| | Photo-degradation ratio | Δ | ○ | □ | □ | □ | Δ | x |
| 1300 Pa | Voc | □ | □ | ○ | □ | Δ | Δ | x |
| | Jsc | Δ | □ | □ | □ | ○ | Δ | x |
| | FF | Δ | □ | □ | □ | Δ | Δ | x |
| | η | ○ | □ | ○ | □ | Δ | Δ | x |
| | Photo-degradation ratio | Δ | ○ | □ | □ | Δ | Δ | x |
| 1500 Pa | Voc | ○ | □ | ○ | □ | Δ | x | x |
| | Jsc | ○ | □ | □ | □ | Δ | Δ | x |
| | FF | Δ | □ | ○ | □ | Δ | x | x |
| | η | ○ | □ | ○ | □ | Δ | Δ | x |
| | Photo-degradation ratio | Δ | ○ | □ | □ | Δ | x | x |

As is seen from FIG. 7 and Table 2, the photovoltaic elements formed according to the conditions (in FIG. 7, the conditions indicated/by 703, 704, and 705) of forming a deposited film of the present invention have high conversion efficiency, and thus, solar cells having a low photodegradation ratio was obtained.

Further, with regard to regions outside the above-mentioned regions of conditions for deposited film formation according to the present invention, all of the above-mentioned characteristics were inferior to those within the regions which satisfy the above-mentioned conditions for deposited film formation according to the present invention. In particular, the conversion efficiency was lower in the polysilane region. The open circuit voltage and the short circuit current of unit elements constituting photovoltaic elements formed under the same conditions were measured, and it was confirmed that, compared with the case of the unit elements constituting the photovoltaic elements formed under the conditions for deposited film formation according to the present invention, both the open circuit voltage and the short circuit current were lower by 5% or more.

Moreover, depending on the amount of polysilane generated, the elements can not function as photovoltaic elements. Further, it is seen that, in the amorphous region, the photodegradation ratio became relatively larger.

On the other hand, even in the amorphous region, the photovoltaic element formed under the conditions for forming a deposited film according to the present invention (the conditions indicated by 705 in FIG. 7) has a high conversion efficiency, has excellent voltage characteristics, and has a smaller photodegradation ratio than that of a photovoltaic element formed under conditions in the amorphous region outside the range according to the present invention. As a result, a solar cell thinner than a photoelectric conversion element which uses a deposited film containing microcrystalline silicon as a photoactive layer was obtained.

Example 2

Samples of a solar cell (single cell) having a pin structure such as illustrated in FIG. 3 were made by following the same procedure as in Example 1 with the exception that the substrate temperature when the i-type layer was formed was changed as shown in the following Table 3.

TABLE 3

| | n-type layer | n/i buffer layer | i-type layer | p/i buffer layer | p-type layer |
|---|---|---|---|---|---|
| Gas species and flow rate | | | | | |
| SiH$_4$ (sccm) | 30 | 15 | 500 | 50 | 50 |
| SiF$_4$ (sccm) | | | 200 | | |
| H$_2$ (slm) | 3.6 | 4 | 10 | 0.4 | 15 |
| PH$_3$ (%) | 5 | | | | |
| BF$_3$ (%) | | | | | 30 |
| Bias voltage (V) | 0 | 0 | −60 | 0 | 0 |
| Substrate temperature (° C.) | 220 | 250 | 100 to 350 | 220 | 150 |
| Pressure (Pa) | 1000 | 1000 | 1000 | 1000 | 1000 |
| High frequency power (kW) | 0.2 (RF) | 1.2 (VHF) | 5 (VHF) | 0.2 (RF) | 1.5 (RF) |
| Interelectrode distance (mm) | 10 | 15 | 7 | 15 | 10 |
| Film thickness (nm) | 20 | 10 | 200/1500 | 10 | 5 |

The results are shown in Table 4 below. Incidentally, the item "region" in the characteristics of Table 4 is intended to mean classification of "amorphous region", "microcrystalline region", and "polysilane region" according to the results of the SEM observation and the RAMAN measurement of the formed samples.

TABLE 4

| Characteistics | Substrate temperature (° C.) | | | | | | | | | | | | |
|---|---|---|---|---|---|---|---|---|---|---|---|---|---|
| | 100 | 130 | 150 | 160 | 170 | 180 | 190 | 200 | 210 | 220 | 250 | 300 | 350 |
| Voc | x | x | Δ | Δ | □ | □ | □ | □ | □ | □ | □ | □ | ○ |
| Jsc | x | x | Δ | ○ | □ | □ | □ | □ | □ | ○ | ○ | ○ | Δ |
| FF | x | x | Δ | Δ | □ | □ | □ | □ | □ | □ | ○ | ○ | ○ |
| η | x | x | Δ | Δ | □ | □ | □ | □ | □ | □ | □ | □ | ○ |
| Photodegradation ratio | x | x | Δ | Δ | □ | □ | □ | □ | □ | ○ | ○ | Δ | Δ |
| Region | Polysilane region | | | | Microcrystalline region | | | | | | Amorphous region | | |

As is seen from Table 4, solar cells having a high conversion efficiency and a low photodegradation ratio were obtained under the conditions for deposited film formation according to the present invention.

Further, with regard to solar cells made under conditions of regions outside the regions of the conditions for deposited film formation according to the present invention, all of the above-mentioned characteristics were relatively inferior to those made under the conditions within the ranges which satisfy the conditions for deposited film formation according to the present invention. In particular, the conversion efficiency was lower in the polysilane region. Moreover, when the open circuit voltage and the short circuit current of unit elements constituting photovoltaic elements made under the same conditions were measured, it was confirmed that, compared with the case of the unit elements constituting the photovoltaic elements made under the conditions for deposited film formation according to the present invention, both the open circuit voltage and the short circuit current were lower by 5% or more.

Moreover, depending on the amount of polysilane generated, the element can not function as a photovoltaic element. Further, it is seen that, in the amorphous region, the photodegradation ratio becomes relatively larger.

On the other hand, even in the amorphous region, the photovoltaic element made under the conditions for deposited film formation according to the present invention has a high conversion efficiency, has excellent voltage characteristics, and has a smaller photodegradation ratio compared with the photovoltaic element in the amorphous region outside the range according to the present invention. A solar cell thinner than an optoelectronic conversion device which uses a deposited film containing microcrystalline silicon as a photoactive layer was obtained.

Example 3

Samples of a solar cell (single cell) having a pin structure such as illustrated in FIG. 3 were made by following the same procedure as in Example 1 with the exception that the bias voltage with respect to the interelectrode distance when the i-type layer was formed was changed as shown in Table 5 below.

TABLE 5

| | n-type layer | n/i buffer layer | i-type layer | p/i buffer layer | p-type layer |
|---|---|---|---|---|---|
| Gas species and flow rate | | | | | |
| $SiH_4$ (sccm) | 30 | 15 | 500 | 50 | 50 |
| $SiF_4$ (sccm) | | | 200 | | |
| $H_2$ (slm) | 3.6 | 4 | 10 | 0.4 | 15 |
| $PH_3$ (%) | 5 | | | | |
| $BF_3$ (%) | | | | | 30 |
| Bias voltage (V/cm) | 0 | 0 | 0 to −400 | 0 | 0 |
| Substrate temperature (° C.) | 220 | 250 | 190 | 220 | 150 |
| Pressure (Pa) | 1000 | 1000 | 1000 | 1000 | 1000 |
| High frequency power (kW) | 0.2 (RF) | 1.2 (VHF) | 5 (VHF) | 0.2 (RF) | 1.5 (RF) |
| Interelectrode distance (mm) | 10 | 15 | 7 | 15 | 10 |
| Film thickness (nm) | 20 | 10 | 200/1500 | 10 | 5 |

The results are shown in Table 6 below. Incidentally, the item "region" in the characteristics of Table 6 is intended to mean classification of "amorphous region", "microcrystalline region", and "polysilane region" according to the results of the SEM observation and the RAMAN measurement of the formed samples.

TABLE 6

| Characteristics | Bias voltage (V/cm) | | | | | | | | | | |
|---|---|---|---|---|---|---|---|---|---|---|---|
| | 0 | −10 | −30 | −50 | −100 | −150 | −200 | −250 | −300 | −350 | −400 |
| Voc | x | Δ | Δ | □ | □ | □ | □ | □ | ○ | Δ | x |
| Jsc | x | Δ | ○ | ○ | □ | □ | □ | □ | ○ | ○ | Δ |
| FF | x | Δ | Δ | □ | □ | □ | □ | □ | ○ | Δ | Δ |
| η | x | Δ | ○ | □ | □ | □ | □ | □ | ○ | ○ | x |

TABLE 6-continued

| Characteristics | Bias voltage (V/cm) | | | | | | | | | | |
|---|---|---|---|---|---|---|---|---|---|---|---|
| | 0 | −10 | −30 | −50 | −100 | −150 | −200 | −250 | −300 | −350 | −400 |
| Photodegradation ratio | x | Δ | Δ | ○ | ○ | □ | □ | □ | □ | ○ | x |
| Region | Polysilane region | | Amorphous region | | | Microcrystalline region | | | | | |

As is seen from Table 6, solar cells having a high conversion efficiency and a low photodegradation ratio were obtained under the conditions for deposited film formation according to the present invention.

Further, with regard to solar cells made under conditions of regions outside the regions of the conditions for deposited film formation according to the present invention, all of the above-mentioned characteristics were relatively inferior to those made under the conditions within the ranges which satisfy the conditions for deposited film formation according to the present invention. In particular, the conversion efficiency was lower in the polysilane region. Moreover, when the open circuit voltage and the short circuit current of unit elements constituting photovoltaic elements made under the same conditions were measured, it was confirmed that, compared with the case of the unit elements constituting the photovoltaic elements made under the conditions for deposited film formation according to the present invention, both the open circuit voltage and the short circuit current were lower by 5% or more.

Moreover, it can be seen that, depending on the amount of polysilane generated, the element can not function as a photovoltaic element.

Example 4

Samples of a solar cell (single cell) having a pin structure such as illustrated in FIG. 3 were made by following the same procedure as in Example 1 with the exception that the bias current with respect to the electrode area when the i-type layer was formed was changed as shown in Table 7 below. Here, the area of the electrode used for applying high frequency power was 3920 cm$^2$.

TABLE 7

| | n-type layer | n/i buffer layer | i-type layer | p/i buffer layer | p-type layer |
|---|---|---|---|---|---|
| Gas species and flow rate | | | | | |
| SiH$_4$ (sccm) | 30 | 15 | 500 | 50 | 50 |
| SiF$_4$ (sccm) | | | 200 | | |
| H$_2$ (slm) | 3.6 | 4 | 10 | 0.4 | 15 |
| PH$_3$ (%) | 5 | | | | |
| BF$_3$ (%) | | | | | 30 |
| Bias current (mA/cm$^2$) | 0 | 0 | 0.1 to 1.5 | 0 | 0 |
| Substrate Temperature (° C.) | 220 | 250 | 190 | 220 | 150 |
| Pressure (Pa) | 1000 | 1000 | 1000 | 1000 | 1000 |
| High Frequency power (kW) | 0.2 (RF) | 1.2 (VHF) | 5 (VHF) | 0.2 (RF) | 1.5 (RF) |

TABLE 7-continued

| | n-type layer | n/i buffer layer | i-type layer | p/i buffer layer | p-type layer |
|---|---|---|---|---|---|
| Interelectrode distance (mm) | 10 | 15 | 7 | 15 | 10 |
| Film thickness (nm) | 20 | 10 | 200/1500 | 10 | 5 |

The results are shown in Table 8 below. Incidentally, the item "region" in the characteristics of Table 8 is intended to mean classification of "amorphous region", "microcrystalline region", and "polysilane region" according to the results of the SEM observation and the RAMAN measurement of the formed samples.

TABLE 8

| Charac- teristics | Bias current (mA/cm$^2$) | | | | | | | | | | | | | |
|---|---|---|---|---|---|---|---|---|---|---|---|---|---|---|
| | 0 | 0.05 | 0.1 | 0.2 | 0.3 | 0.4 | 0.5 | 0.6 | 0.7 | 0.8 | 0.9 | 1.0 | 1.2 | |
| Voc | x | Δ | Δ | ○ | ○ | □ | □ | □ | □ | ○ | Δ | Δ | x | |
| Jsc | x | Δ | Δ | Δ | □ | □ | □ | □ | □ | □ | ○ | ○ | Δ | |
| FF | x | Δ | Δ | ○ | ○ | □ | □ | □ | □ | ○ | Δ | Δ | Δ | |
| η | x | Δ | Δ | Δ | ○ | □ | □ | □ | □ | ○ | ○ | Δ | x | |
| Photo- degra- dation ratio | x | x | Δ | Δ | ○ | ○ | ○ | □ | □ | □ | ○ | ○ | Δ | |
| Region | Polysilane region | | | Amorphous region | | | | Microcrystalline region | | | | | | |

As is seen from Table 8, solar cells having a high conversion efficiency and a low photodegradation ratio were obtained under the conditions for deposited film formation according to the present invention.

Further, with regard to solar cells made under conditions of regions outside the regions of the conditions for deposited film formation according to the present invention, all of the above-mentioned characteristics were relatively inferior to those made under the conditions within the ranges which satisfy the conditions for deposited film formation according to the present invention. In particular, the conversion efficiency was lower in the polysilane region. Moreover, when the open circuit voltage and the short circuit current of unit elements constituting photovoltaic elements made under the same conditions were measured, it was confirmed that, compared with the case of the unit elements constituting the photovoltaic elements made under the conditions for deposited film formation according to the present invention, both the open circuit voltage and the short circuit current were lower by 5% or more.

Moreover, it can be seen that, depending on the amount of polysilane generated, the element can not function as a photovoltaic element.

Example 5

Samples of a solar cell (single cell) having a pin structure such as illustrated in FIG. 3 were made by following the same procedure as in Example 1 with the exception that the high frequency power density when the i-type layer was formed was changed as shown in Table 9 below. At this time, the area of the electrode used for applying high frequency power was 3920 cm$^2$.

TABLE 9

|  | n-type layer | n/i buffer layer | i-type layer | p/i buffer layer | p-type layer |
|---|---|---|---|---|---|
| Gas species and flow rate |  |  |  |  |  |
| SiH$_4$ (sccm) | 30 | 15 |  | 50 | 50 |
| SiF$_4$ (sccm) |  |  | 500 |  |  |
| H$_2$ (slm) | 3.6 | 4 | 200 | 0.4 | 15 |
| PH$_3$ (%) | 5 |  | 10 |  |  |
| BF$_3$ (%) |  |  |  |  | 30 |
| Bias voltage (V) | 0 | 0 | −100 | 0 | 0 |
| Substrate temperature (° C.) | 220 | 250 | 190 | 220 | 150 |
| Pressure (Pa) | 1000 | 1000 | 1000 | 1000 | 1000 |
| High Frequency power (kW) | 0.2 (RF) | 1.2 (VHF) | 1 to 10 (VHF) | 0.2 (RF) | 1.5 (RF) |
| Interelectrode distance (mm) | 10 | 15 | 7 | 15 | 10 |
| Film thickness (nm) | 20 | 10 | 200/1500 | 10 | 5 |

The results are shown in Table 10 below. Incidentally, the item "region" in the characteristics of Table 10 is intended to mean classification of "amorphous region", "microcrystalline region", and "polysilane region" according to the results of the SEM observation and the RAMAN measurement of the formed samples.

TABLE 10

|  | High Frequency Power density (w/cm$^3$) |  |  |  |  |  |  |  |  |
|---|---|---|---|---|---|---|---|---|---|
| Characteristics | 0.25 | 0.5 | 0.75 | 1.0 | 1.25 | 1.5 | 1.75 | 2.0 | 2.5 |
| Voc | Δ | Δ | ○ | □ | □ | □ | □ | ○ | Δ |
| Jsc | x | Δ | ○ | ○ | □ | □ | □ | □ | ○ |
| FF | x | Δ | ○ | □ | □ | □ | □ | ○ | Δ |
| η | x | Δ | ○ | □ | □ | □ | □ | ○ | Δ |
| Photodegradation ratio | x | Δ | ○ | ○ | ○ | □ | □ | ○ | Δ |
| Region | Polysilane region |  | Amorphous region |  |  | Microcrystalline region |  |  |  |

As is seen from Table 10, solar cells having a high conversion efficiency and a low photodegradation ratio were obtained under the conditions for deposited film formation according to the present invention.

Further, with regard to solar cells made under conditions of regions outside the regions of the conditions for deposited film formation according to the present invention, all of the above-mentioned characteristics were relatively inferior to those made under the conditions within the ranges which satisfy the conditions for deposited film formation according to the present invention. In particular, the conversion efficiency was lower in the polysilane region. Moreover, when the open circuit voltage and the short circuit current of unit elements constituting photovoltaic elements made under the same conditions were measured, it was confirmed that, compared with the case of the unit elements constituting the photovoltaic elements made under the conditions for deposited film formation according to the present invention, both the open circuit voltage and the short circuit current were lower by 5% or more.

Moreover, it can be seen that, depending on the amount of polysilane generated, the element can not function as a photovoltaic element.

Example 6

Samples of a solar cell (single cell) having a pin structure such as illustrated in FIG. 3 were made by following the same procedure as in Example 1 with the exception that the high frequency power with respect to the source gas flow rate when the i-type layer was formed was changed as shown in Table 11 below.

TABLE 11

|  | n-type layer | n/i buffer layer | i-type layer | p/i buffer layer | p-type layer |
|---|---|---|---|---|---|
| Gas species and flow rate |  |  |  |  |  |
| SiH$_4$ (sccm) | 30 | 15 | 50 to 3000 | 50 | 50 |
| SiF$_4$ (sccm) |  |  | 200 |  |  |
| H$_2$ (slm) | 3.6 | 4 | 10 | 0.4 | 15 |
| PH$_3$ (%) | 5 |  |  |  |  |
| BF$_3$ (%) |  |  |  |  | 30 |
| Bias Voltage (V/cm) | 0 | 0 | −100 | 0 | 0 |
| Substrate temperature (° C.) | 220 | 250 | 190 | 220 | 150 |
| Pressure (Pa) | 1000 | 1000 | 1000 | 1000 | 1000 |
| High Frequency power (kW) | 0.2 (RF) | 1.2 (VHF) | 5 (VHF) | 0.2 (RF) | 1.5 (RF) |
| Interelectrode distance (mm) | 10 | 15 | 7 | 15 | 10 |
| Film thickness (nm) | 20 | 10 | 200/1500 | 10 | 5 |

The results are shown in Table 12 below. Incidentally, the item "region" in the characteristics of Table 6 is intended to mean classification of "amorphous region", "microcrystalline region", and "polysilane region" according to the results of the SEM observation and the RAMAN measurement of the formed samples.

TABLE 12

|  | Source gas flow rate (w/sccm) |  |  |  |  |  |  |  |  |  |
|---|---|---|---|---|---|---|---|---|---|---|
| Characteristics | 50 | 25 | 15 | 12 | 10 | 7 | 5 | 4 | 3 | 2 |
| Voc | ○ | □ | □ | □ | □ | □ | □ | ○ | Δ | x |
| Jsc | Δ | ○ | □ | □ | □ | □ | □ | ○ | Δ | x |
| FF | Δ | ○ | □ | □ | □ | □ | □ | Δ | Δ | x |
| η | Δ | ○ | □ | □ | □ | □ | □ | ○ | Δ | x |

TABLE 12-continued

| Characteristics | Source gas flow rate (w/sccm) | | | | | | | | | |
|---|---|---|---|---|---|---|---|---|---|---|
| | 50 | 25 | 15 | 12 | 10 | 7 | 5 | 4 | 3 | 2 |
| Photo Degradation ratio | Δ | ○ | ○ | □ | □ | □ | □ | Δ | Δ | x |
| Region | Amorphous region | | | Microcrystalline region | | | | Polysilane region | | |

As is seen from Table 12, solar cells having a high conversion efficiency and a low photodegradation ratio were obtained under the conditions for deposited film formation according to the present invention.

Further, with regard to solar cells made under conditions of regions outside the regions of the conditions for deposited film formation according to the present invention, all of the above-mentioned characteristics were relatively inferior to those made under the conditions within the ranges which satisfy the conditions for deposited film formation according to the present invention. In particular, the conversion efficiency was lower in the polysilane region. Moreover, when the open circuit voltage and the short circuit current of unit elements constituting photovoltaic elements made under the same conditions were measured, it was confirmed that, compared with the case of the unit elements constituting the photovoltaic elements made under the conditions for deposited film formation according to the present invention, both the open circuit voltage and the short circuit current were lower by 5% or more.

Moreover, it can be seen that, depending on the amount of polysilane generated, the element can not function as a photovoltaic element. Further, it can be seen that, in the amorphous region, the photodegradation ratio becomes relatively higher.

Example 7

Samples of a solar cell (single cell) having a pin structure such as illustrated in FIG. 3 were made by following the same procedure as in Example 1 with the exception that the ratio of the diluting gas flow rate to the source gas flow rate when the i-type layer was formed was changed as shown in Table 13 below.

TABLE 13

| | n-type layer | n/i buffer layer | i-type layer | p/i buffer layer | p-type layer |
|---|---|---|---|---|---|
| Gas species and flow rate | | | | | |
| $SiH_4$ (sccm) | 30 | 15 | | 50 | 50 |
| $SiF_4$ (sccm) | | | 1000 | | |
| $H_2$ (slm) | 3.6 | 4 | 200 | 0.4 | 15 |
| $PH_3$ (%) | 5 | | | | |
| | | | 0 to 40 | | |
| $BF_3$ (%) | | | | | 30 |
| Bias Voltage (V) | 0 | 0 | −100 | 0 | 0 |
| Substrate temperature (° C.) | 220 | 250 | 190 | 220 | 150 |
| Pressure (Pa) | 1000 | 1000 | 1000 | 1000 | 1000 |
| High Frequency power (kW) | 0.2 (RF) | 1.2 (VHF) | 5 (VHF) | 0.2 (RF) | 1.5 (RF) |
| Interelectrode distance (mm) | 10 | 15 | 7 | 15 | 10 |

TABLE 13-continued

| | n-type layer | n/i buffer layer | i-type layer | p/i buffer layer | p-type layer |
|---|---|---|---|---|---|
| Film thickness (nm) | 20 | 10 | 200/1500 | 10 | 5 |

The results are shown in Table 14 below. Incidentally, the item "region" in the characteristics of Table 14 is intended to mean classification of "amorphous region", "microcrystalline region", and "polysilane region" according to the results of the SEM observation and the RAMAN measurement of the formed samples.

TABLE 14

| Characteristics | Ratio of diluting gas flow rate | | | | | | | | | |
|---|---|---|---|---|---|---|---|---|---|---|
| | 0 | 2 | 3 | 5 | 7 | 10 | 15 | 20 | 25 | 30 | 40 |
| Voc | x | Δ | ○ | □ | □ | □ | □ | ○ | ○ | ○ | Δ |
| Jsc | x | Δ | Δ | ○ | □ | □ | □ | □ | □ | ○ | ○ |
| FF | x | Δ | Δ | ○ | □ | □ | □ | □ | ○ | ○ | Δ |
| η | x | Δ | ○ | ○ | □ | □ | □ | □ | ○ | ○ | ○ |
| Photo Degradation ratio | x | Δ | ○ | ○ | ○ | ○ | □ | □ | ○ | ○ | ○ |
| Region | Polysilane region | | Amorphous region | | | | Microcrystalline region | | | |

As is seen from Table 14, solar cells having a high conversion efficiency and a low photodegradation ratio were obtained under the conditions for deposited film formation according to the present invention.

Further, with regard to solar cells made under conditions of regions outside the regions of the conditions for deposited film formation according to the present invention, all of the above-mentioned characteristics were relatively inferior to those made under the conditions within the ranges which satisfy the conditions for deposited film formation according to the present invention. In particular, the conversion efficiency was lower in the polysilane region. Moreover, when the open circuit voltage and the short circuit current of unit elements constituting photovoltaic elements made under the same conditions were measured, it was confirmed that, compared with the case of the unit elements constituting the photovoltaic elements made under the conditions for deposited film formation according to the present invention, both the open circuit voltage and the short circuit current were lower by 5% or more.

Moreover, it can be seen that, depending on the amount of polysilane generated, the element can not function as a photovoltaic element.

Example 8

Samples of a solar cell having a pin structure (double cell or triple cell) were made by following the same procedure as in Example 1 with the exception that the layer configuration of the samples was changed to the double or triple structure illustrated in FIG. 1, 2, or 4, and the balance of the film thicknesses of the respective layers was appropriately adjusted. When evaluation was made similarly to that in Example 1, solar cells having a high photoelectric conversion efficiency and a small photodegradation ratio were obtained within the range of the conditions for deposited film formation according to the present invention, as is the case with Example 1.

Example 9

Based on the results of Examples 1 to 8, regarding the conditions for forming the deposited film which can produce the effects of the present invention, samples were made by following the same procedure as in Example 1 while minutely changing the respective parameters, and evaluation was made similarly to that in Example 1. As a result, regarding the conditions for forming the deposited film under which effects of the present invention could produced, by controlling, based on the boundary conditions between the polysilane region and the microcrystalline region and the boundary conditions between the amorphous region and the microcrystalline region, at least one of the conditions selected from (a) a high frequency power density, (b) a bias voltage with respect to an interelectrode distance, (c) a bias current with respect to an electrode area, (d) a high frequency power with respect to a source gas flow rate, (e) a ratio of a diluting gas flow rate to a source gas flow rate, (f) a substrate temperature, (g) a pressure, and (h) an interelectrode distance to be within the range expressed by the following conditional equations, the effects of the present invention were confirmed.

Conditional Equations: $0<a\leq0.5$ W/cm$^2$; $0<b\leq150$ V/cm; $0<c\leq0.3$ MA/cm$^2$; $0<d\leq3$ W/sccm; $0<e\leq10$; $0<f\leq20°$ C.; $0<g\leq200$ Pa; and $0<h\leq5$ mm.

Further, within the range of the following conditional equations, more excellent effects were confirmed: $0<a\leq0.3$ W/cm$^2$; $0<b\leq120$ V/cm; $0<c\leq0.2$ mA/cm$^2$; $0<d\leq2$ W/sccm; $0<e\leq8$; $0<f\leq10°$ C.; $0<g\leq100$ Pa; and $0<h\leq3$ mm.

Still further, within the range of the following conditional equations, most excellent effects were confirmed: $0<a\leq0.2$ W/cm$^2$; $0<b\leq100$ V/cm; $0<c\leq0.1$ mA/cm$^2$; $0<d\leq1$ W/sccm; $0<e\leq5$; $0<f\leq5°$ C.; $0<g\leq50$ Pa; and $0<h\leq2$ mm.

Example 10

Samples were made by following the same procedure as in Examples 1 to 8 with the exception that, in the deposited film forming apparatus used in Examples 1 to 8, the volume of the first vacuum vessel (denoted by reference numeral 604 in FIG. 6) of the i-type layer forming chamber was decreased by 50% and the number of the exhaust ports (denoted by reference numeral 606 in FIG. 6) was changed from 4 to 2, and evaluation was made similarly to that in Example 1. As a result, regarding the conditions for forming the deposited film under which effects of the present invention can be produced, by controlling, based on the boundary conditions between the polysilane region and the microcrystalline region and the boundary conditions between the amorphous region and the microcrystalline region, at least one of the conditions selected from (a) a high frequency power density, (b) a bias voltage with respect to an interelectrode distance, (c) a bias current with respect to an electrode area, (d) a high frequency power with respect to a source gas flow rate, (e) a ratio of a diluting gas flow rate to a source gas flow rate, (f) a substrate temperature, (g) a pressure, and (h) an interelectrode distance to be within the range expressed by the following conditional equations, the effects of the present invention were confirmed.

Conditional Equations: $0<a\leq0.5$ W/cm$^2$; $0<b\leq150$ V/cm; $0<c\leq0.3$ MA/cm$^2$; $0<d\leq3$ W/sccm; $0<e\leq10$; $0<f\leq20°$ C.; $0<g\leq200$ Pa; and $0<h\leq5$ mm.

Further, within the range of the following conditional equations, more excellent effects were confirmed: $0<a\leq0.3$ W/cm$^2$; $0<b\leq120$ V/cm; $0<c\leq0.2$ mA/cm$^2$; $0<d\leq2$ W/sccm; $0<e\leq8$; $0<f\leq10°$ C.; $0<g\leq100$ Pa; and $0<h\leq3$ mm.

Still further, within the range of the following conditional equations, most excellent effects were confirmed: $0<a\leq0.2$ W/cm$^2$; $0<b\leq100$ V/cm; $0<c\leq0.1$ mA/cm$^2$; $0<d\leq1$ W/sccm; $0<e\leq5$; $0<f\leq5°$ C.; $0<g\leq50$ Pa; and $0<h\leq2$ mm.

According to the present invention, by forming a deposited film under conditions of a predetermined range in the vicinity of boundary conditions under which the crystal system of the deposited film substantially changes between an amorphous state and a microcrystalline state, the conditions for deposited film formation can be optimized, so that a balance can be struck between the improvement in conversion efficiency and the suppression of photodegradation at a high level. In particular, a deposited film containing microcrystalline silicon or a deposited film substantially comprised of amorphous silicon which has the optimal characteristics depending on the required element characteristics can be formed. Further, the optimum conditions for forming a deposited film determined with an experimental apparatus can easily be diverted to a manufacturing apparatus or the like.

Further, by using such a method of forming a deposited film, the cost of manufacturing a photovoltaic element can be drastically reduced.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-026625, filed Feb. 3, 2006, which is hereby incorporated by reference in its entirety.

What is claimed is:

1. A method of forming a deposited film comprising microcrystalline silicon or a deposited film comprising amorphous silicon by plasma CVD, the method comprising:
changing at least one of conditions selected from (a) a high frequency power density, (b) a bias voltage with respect to an interelectrode distance, (c) a bias current with respect to an electrode area, (d) a high frequency power with respect to a source gas flow rate, (e) a ratio of a diluting gas flow rate to a source gas flow rate, (f) a substrate temperature, (g) a pressure, and (h) an interelectrode distance from boundary conditions that change between conditions for forming a deposited film of a microcrystalline region in which a ratio of a Raman scattering intensity due to a crystalline component of a crystalline substance to a Raman scattering intensity due to an amorphous component is more than one and conditions for forming a deposited film of an amorphous region in which a ratio of a Raman scattering intensity due to a crystalline component of a crystalline substance to a Raman scattering intensity due to an amorphous component is less than one, within a range represented by the equations of $0<a\leq0.5$ W/cm$^2$; $0<b\leq150$ V/cm; $0<c\leq0.3$ mA/cm$^2$; $0<d\leq3$ W/sccm; $0<e\leq10$; $0<f\leq20°$ C.; $0<g\leq200$ Pa; and $0<h\leq5$ mm.

2. The method according to claim 1, wherein the boundary conditions are such that a ratio of a Raman scattering intensity due to a crystalline component of the deposited film to a Raman scattering intensity due to an amorphous component thereof is changed from three or more to one or less.

3. The method according to claim 1, wherein the boundary conditions are such that both an open circuit voltage value and a short circuit current value of a photovoltaic element comprising the deposited film are changed by 5% or more.

4. A method of forming a deposited film comprising microcrystalline silicon by plasma CVD, the method comprising:

changing at least one of conditions selected from (a) a high frequency power density, (b) a bias voltage with respect to an interelectrode distance, (c) a bias current with respect to an electrode area, (d) a high frequency power with respect to a source gas flow rate, (e) a ratio of a diluting gas flow rate to a source gas flow rate, (f) a substrate temperature, (g) a pressure, and (h) an interelectrode distance from conditions for forming a deposited film of a microcrystalline region in which a ratio of a Raman scattering intensity due to a crystalline component of a crystalline substance to a Raman scattering intensity due to an amorphous component is more than one and conditions within a predetermined range in the vicinity of boundary conditions for forming a deposited film of a region in which powder comprising silicon atoms is generated, within a range represented by the equations of $0<a\leqq0.5$ W/cm$^2$; $0<b\leqq150$ V/cm; $0<c\leqq0.3$ mA/cm$^2$; $0<d\leqq3$ W/sccm; $0<e\leqq10$; $0<f\leqq20°$ C.; $0<g\leqq200$ Pa; and $0<h\leqq5$ mm.

* * * * *